(12) United States Patent
Yang et al.

(10) Patent No.: US 11,903,216 B2
(45) Date of Patent: Feb. 13, 2024

(54) THREE-DIMENSIONAL MEMORY DEVICE AND METHOD

(71) Applicant: Taiwan Semiconductor Manufacturing Co., Ltd., Hsinchu (TW)

(72) Inventors: Feng-Cheng Yang, Zhudong Township (TW); Meng-Han Lin, Hsinchu (TW); Sheng-Chen Wang, Hsinchu (TW); Han-Jong Chia, Hsinchu (TW); Chung-Te Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/744,212

(22) Filed: May 13, 2022

(65) Prior Publication Data
US 2022/0278130 A1    Sep. 1, 2022

Related U.S. Application Data

(63) Continuation of application No. 17/018,232, filed on Sep. 11, 2020, now Pat. No. 11,355,516.
(Continued)

(51) Int. Cl.
*H10B 51/20* (2023.01)
*H01L 21/3213* (2006.01)
(Continued)

(52) U.S. Cl.
CPC ....... *H10B 51/20* (2023.02); *H01L 21/32133* (2013.01); *H01L 21/7684* (2013.01);
(Continued)

(58) Field of Classification Search
CPC ......... H01L 27/11597; H01L 21/32133; H01L 21/76802; H01L 21/7684; H01L 21/76871;
(Continued)

(56) References Cited

U.S. PATENT DOCUMENTS 6,274,453 B1   8/2001  Schlosser et al.
8,349,681 B2   1/2013  Alsmeier et al.
(Continued)

FOREIGN PATENT DOCUMENTS

CN   103545279 A    1/2014
CN   109075172 A   12/2018
(Continued)

OTHER PUBLICATIONS

Lue, H. et al., "A Novel 3D AND-type NVM Architecture Capable of High-density, Low-power In-Memory Sum-of-Product Computation for Artificial Intelligence Application," 2018 IEEE Symposium on VLSI Technology, Jun. 18-22, 2018, 2 pages.

*Primary Examiner* — Karen Kusumakar
(74) *Attorney, Agent, or Firm* — Slater Matsil, LLP

(57) ABSTRACT

In accordance with embodiments, a memory array is formed with a multiple patterning process. In embodiments a first trench is formed within a multiple layer stack and a first conductive material is deposited into the first trench. After the depositing the first conductive material, a second trench is formed within the multiple layer stack, and a second conductive material is deposited into the second trench. The first conductive material and the second conductive material are etched.

20 Claims, 41 Drawing Sheets

Related U.S. Application Data

(60) Provisional application No. 63/052,508, filed on Jul. 16, 2020.

(51) Int. Cl.
    *H01L 21/768*     (2006.01)
    *H01L 23/522*     (2006.01)
    *H10B 51/30*     (2023.01)

(52) U.S. Cl.
    CPC .. *H01L 21/76802* (2013.01); *H01L 21/76871* (2013.01); *H01L 21/76877* (2013.01); *H01L 23/5226* (2013.01); *H10B 51/30* (2023.02)

(58) Field of Classification Search
    CPC .......... H01L 21/76877; H01L 23/5226; H01L 27/1159
    See application file for complete search history.

(56) References Cited

U.S. PATENT DOCUMENTS

| | | |
|---|---|---|
| 9,281,044 B2 | 3/2016 | Ramaswamy et al. |
| 9,484,389 B2 | 11/2016 | Wouters et al. |
| 9,496,274 B2 | 11/2016 | Pachamuthu et al. |
| 9,570,464 B1 | 2/2017 | Wakatsuki et al. |
| 9,620,513 B2 | 4/2017 | Lee et al. |
| 9,620,712 B2 | 4/2017 | Hayashi et al. |
| 9,748,257 B2 | 8/2017 | Lee et al. |
| 9,947,721 B2 | 4/2018 | Fantini |
| 9,953,992 B1 | 4/2018 | Ogawa et al. |
| 10,109,639 B1 | 10/2018 | DeForge et al. |
| 10,115,681 B1 | 10/2018 | Ariyoshi |
| 10,256,248 B2 | 4/2019 | Lu et al. |
| 10,283,513 B1 | 5/2019 | Zhou et al. |
| 10,446,437 B2 | 10/2019 | Yang |
| 10,593,399 B2 | 3/2020 | Fratin et al. |
| 10,629,809 B2 | 4/2020 | Yamakawa |
| 10,930,333 B2 | 2/2021 | Chen et al. |
| 11,011,529 B2 | 5/2021 | Ramaswamy |
| 11,133,325 B2 | 9/2021 | Dai et al. |
| 11,152,386 B2 | 10/2021 | Or-Bach et al. |
| 11,195,846 B2 | 12/2021 | Huo |
| 11,355,516 B2 | 1/2022 | Yang et al. |
| 11,423,966 B2 | 8/2022 | Lin et al. |
| 2002/0130345 A1 | 9/2002 | Saigoh et al. |
| 2004/0058493 A1 | 3/2004 | Demange et al. |
| 2010/0123177 A1 | 5/2010 | Ozaki |
| 2010/0181610 A1 | 7/2010 | Kim et al. |
| 2010/0207186 A1 | 8/2010 | Higashi et al. |
| 2011/0049646 A1* | 3/2011 | Lim .............. H01L 23/485 257/E21.409 |
| 2011/0199804 A1 | 8/2011 | Son et al. |
| 2012/0104484 A1 | 5/2012 | Lee et al. |
| 2013/0161821 A1 | 6/2013 | Hwang et al. |
| 2014/0015057 A1 | 1/2014 | Lee et al. |
| 2014/0048868 A1 | 2/2014 | Kim et al. |
| 2014/0160841 A1 | 6/2014 | Koval |
| 2014/0362644 A1 | 12/2014 | Lue et al. |
| 2015/0243674 A1 | 8/2015 | Shih et al. |
| 2016/0027514 A1 | 1/2016 | Sim et al. |
| 2016/0071860 A1 | 3/2016 | Kai et al. |
| 2016/0118404 A1 | 4/2016 | Peng |
| 2016/0148947 A1 | 5/2016 | Seo et al. |
| 2016/0163686 A1 | 6/2016 | Lee et al. |
| 2016/0181259 A1 | 6/2016 | Van Houdt et al. |
| 2016/0322381 A1 | 11/2016 | Liu et al. |
| 2017/0148800 A1 | 5/2017 | Nishikawa et al. |
| 2017/0236831 A1 | 8/2017 | Kim |
| 2017/0301684 A1 | 10/2017 | Park et al. |
| 2017/0373079 A1 | 12/2017 | Sharangpani et al. |
| 2018/0026044 A1 | 1/2018 | Utsumi et al. |
| 2018/0130823 A1 | 5/2018 | Kim |
| 2018/0269229 A1 | 9/2018 | Or-Bach et al. |
| 2019/0067324 A1 | 2/2019 | Zhang et al. |
| 2019/0115071 A1 | 4/2019 | Nardi et al. |
| 2019/0123061 A1 | 4/2019 | Liu |
| 2019/0148286 A1 | 5/2019 | Or-Bach et al. |
| 2019/0172838 A1 | 6/2019 | Jo et al. |
| 2020/0119047 A1* | 4/2020 | Yoo .............. H01L 29/40111 |
| 2020/0152502 A1 | 5/2020 | Hsu |
| 2020/0168630 A1 | 5/2020 | Borukhov |
| 2020/0176464 A1 | 6/2020 | Jang et al. |
| 2020/0185411 A1 | 6/2020 | Herner et al. |
| 2020/0194431 A1 | 6/2020 | Castro et al. |
| 2020/0227428 A1 | 7/2020 | Liu et al. |
| 2020/0227727 A1 | 7/2020 | Li |
| 2020/0286530 A1 | 9/2020 | Lee et al. |
| 2020/0295033 A1 | 9/2020 | Sakamoto et al. |
| 2020/0381037 A1 | 12/2020 | Kim et al. |
| 2021/0043654 A1 | 2/2021 | Yoo et al. |
| 2021/0118861 A1 | 4/2021 | Yun et al. |
| 2021/0175253 A1 | 6/2021 | Han et al. |
| 2021/0202514 A1 | 7/2021 | Han |
| 2021/0217772 A1 | 7/2021 | Zhang |
| 2021/0242241 A1 | 8/2021 | Rajashekhar et al. |
| 2021/0391315 A1 | 12/2021 | Zhang |
| 2021/0407848 A1 | 12/2021 | Chia et al. |
| 2022/0020770 A1 | 1/2022 | Yang et al. |
| 2022/0020771 A1 | 1/2022 | Yang et al. |
| 2022/0037361 A1 | 2/2022 | Lin et al. |
| 2022/0037362 A1 | 2/2022 | Lin et al. |
| 2022/0216223 A1 | 7/2022 | Xu et al. |

FOREIGN PATENT DOCUMENTS

| | | |
|---|---|---|
| CN | 110268523 A | 9/2019 |
| CN | 110447103 A | 11/2019 |
| CN | 110808332 A | 2/2020 |
| CN | 111180451 A | 5/2020 |
| JP | 2015122478 A | 7/2015 |
| KR | 20090125893 A | 12/2009 |
| KR | 20110112727 A | 10/2011 |
| KR | 20140008622 A | 1/2014 |
| KR | 20140024632 A | 3/2014 |
| KR | 20170048393 A | 5/2017 |
| KR | 20170089378 A | 8/2017 |
| KR | 20170131945 A | 12/2017 |
| KR | 20190012061 A | 2/2019 |
| KR | 20190064852 A | 6/2019 |
| KR | 20190105604 A | 9/2019 |
| KR | 20190118751 A | 10/2019 |
| KR | 20200008828 A | 1/2020 |
| KR | 20200035469 A | 4/2020 |
| KR | 20210045538 A | 4/2021 |
| TW | 461083 B | 10/2001 |
| TW | 201510994 A | 3/2015 |
| TW | 201737434 A | 10/2017 |
| TW | 201814839 A | 4/2018 |
| TW | 201905916 A | 2/2019 |
| TW | 201913971 A | 4/2019 |
| TW | 201946253 A | 12/2019 |
| TW | 202010102 A | 3/2020 |
| WO | 2021029916 A1 | 2/2021 |

* cited by examiner

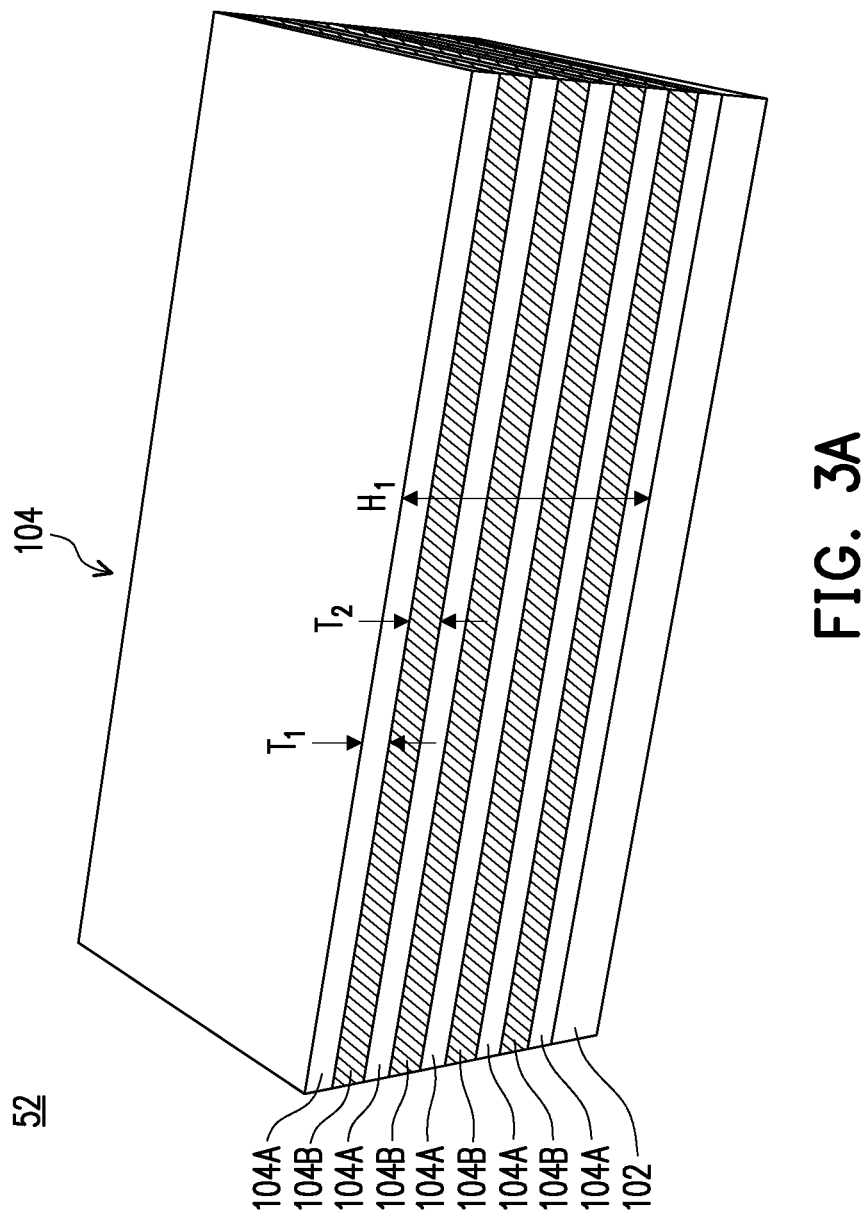

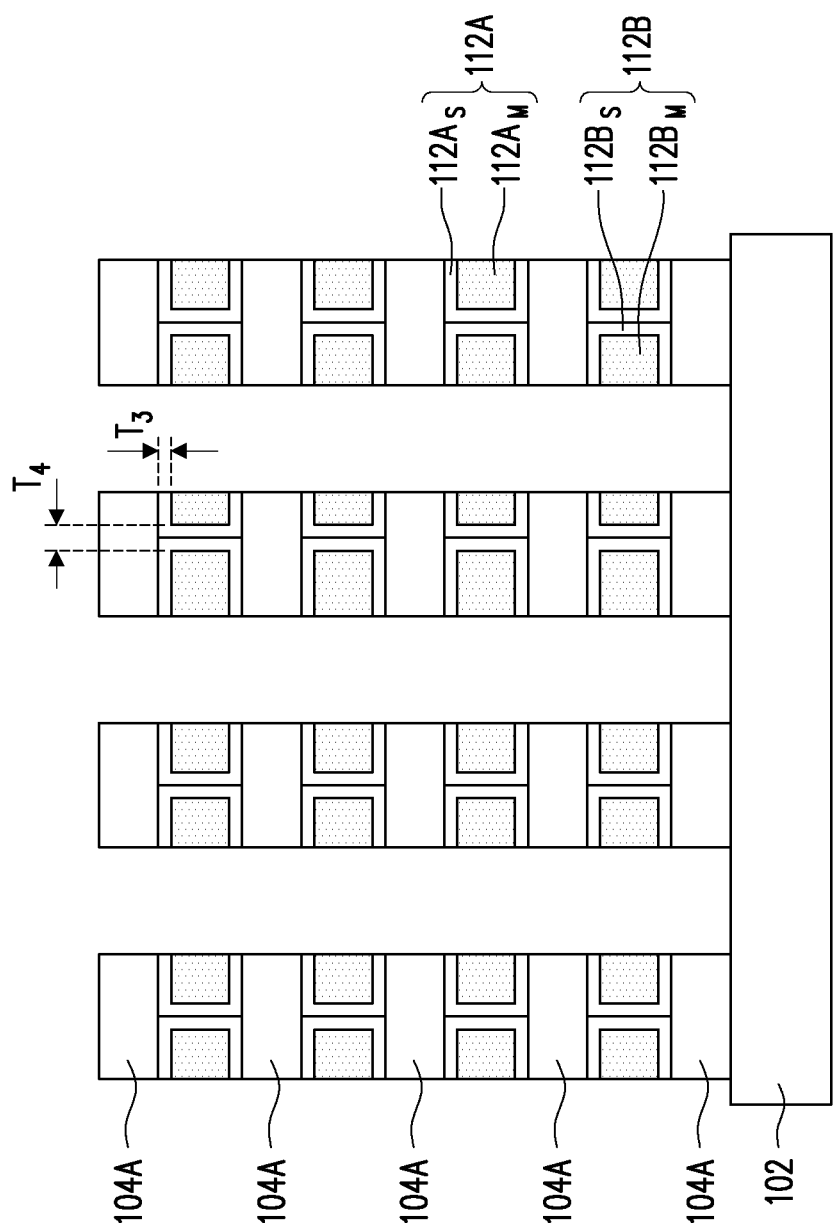

THREE-DIMENSIONAL MEMORY DEVICE AND METHOD

PRIORITY CLAIM AND CROSS-REFERENCE

This application is a continuation of U.S. patent application Ser. No. 17/018,232, filed Sep. 11, 2020, entitled "Three-Dimensional Memory Device and Method," which claims the benefit of U.S. Provisional Application No. 63/052,508, filed on Jul. 16, 2020, which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
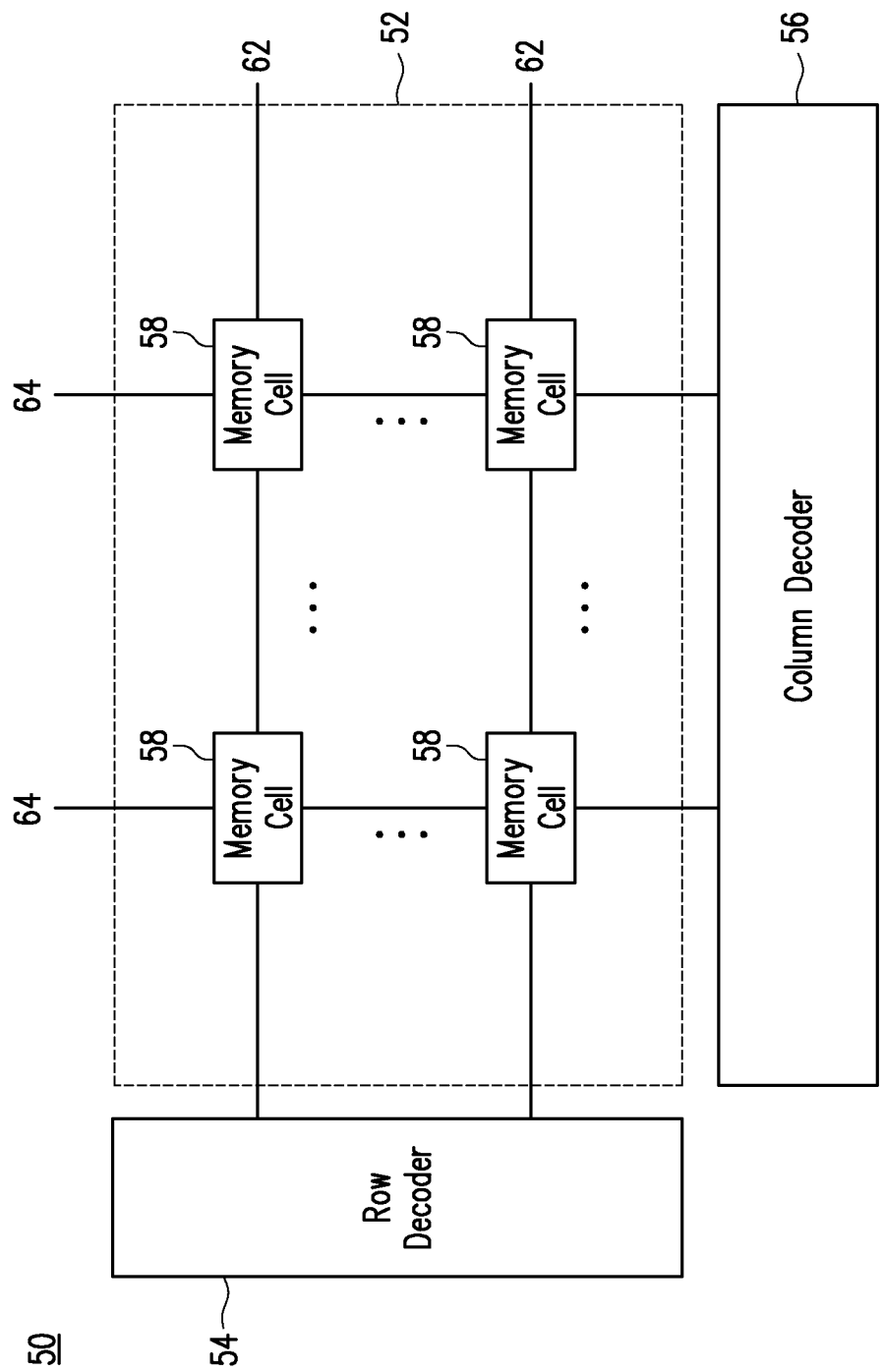
FIG. 1 is a block diagram of a random-access memory, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, word lines for a memory array are formed by a multiple-patterning process, in which first portions of the word lines and a first subset of the transistors for the memory array are formed in a first patterning process, and in which second portions of the word lines and a second subset of the transistors for the memory array are subsequently formed in a second patterning process. The aspect ratio of the columns of the memory array may thus be improved while twisting or collapsing of the features during formation is avoided.

FIG. 1 is a block diagram of a random-access memory 50, in accordance with some embodiments. The random-access memory 50 includes a memory array 52, a row decoder 54, and a column decoder 56. The memory array 52, the row decoder 54, and the column decoder 56 may each be part of a same semiconductor die, or may be parts of different semiconductor dies. For example, the memory array 52 can be part of a first semiconductor die, while the row decoder 54 and the column decoder 56 can be parts of a second semiconductor die.

The memory array 52 includes memory cells 58, word lines 62, and bit lines 64. The memory cells 58 are arranged in rows and columns. The word lines 62 and the bit lines 64 are electrically connected to the memory cells 58. The word lines 62 are conductive lines that extend along the rows of the memory cells 58. The bit lines 64 are conductive lines that extend along the columns of the memory cells 58.

The row decoder 54 may be, e.g., a static CMOS decoder, a pseudo-NMOS decoder, or the like. During operation, the row decoder 54 selects desired memory cells 58 in a row of the memory array 52 by activating the word line 62 for the row. The column decoder 56 may be, e.g., a static CMOS decoder, a pseudo-NMOS decoder, or the like, and may include writer drivers, sense amplifiers, combinations thereof, or the like. During operation, the column decoder 56 selects bit lines 64 for the desired memory cells 58 from columns of the memory array 52 in the selected row, and reads data from or writes data to the selected memory cells 58 with the bit lines 64.

Figure 2A:
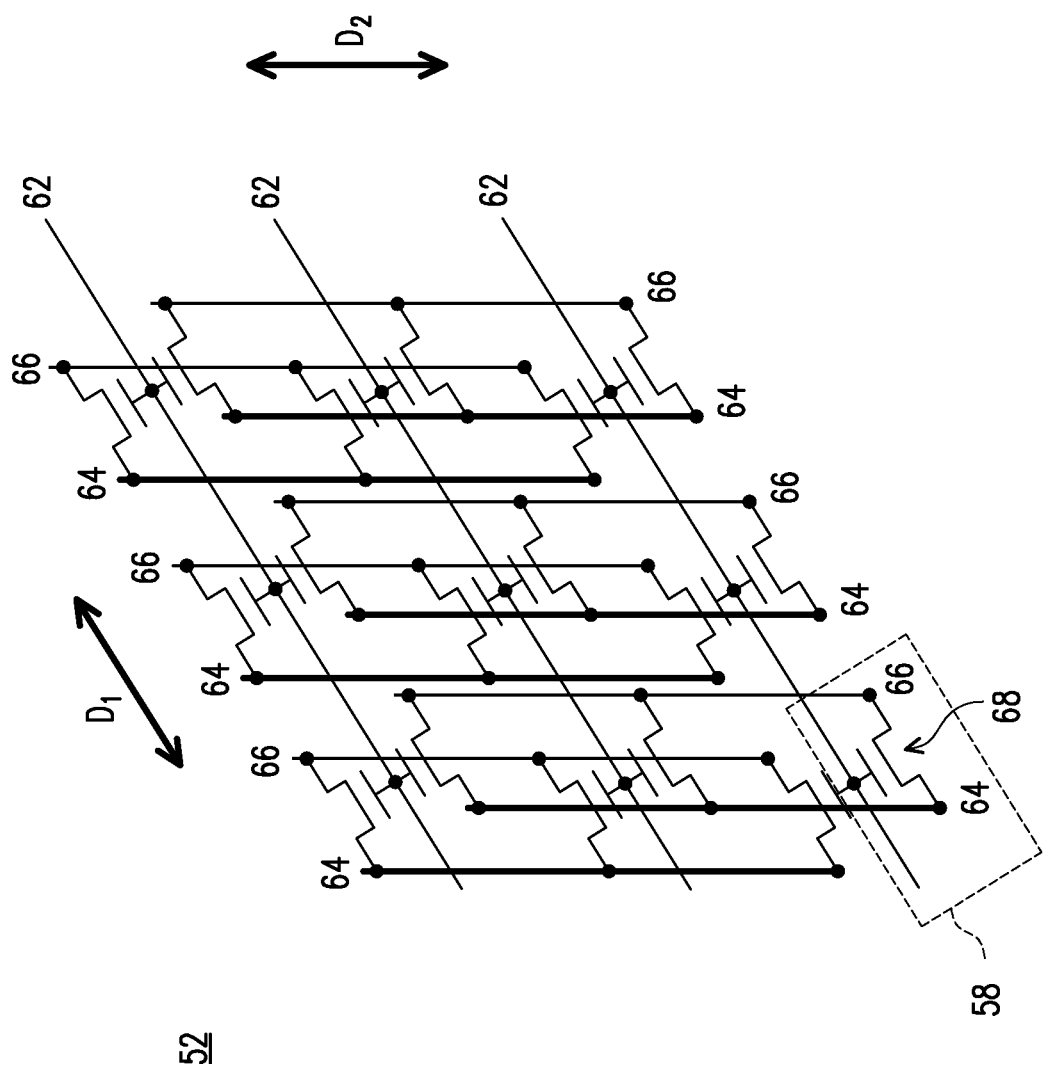
FIGS. 2A and 2B are various views of a memory array, in accordance with some embodiments.
Figure 2B:
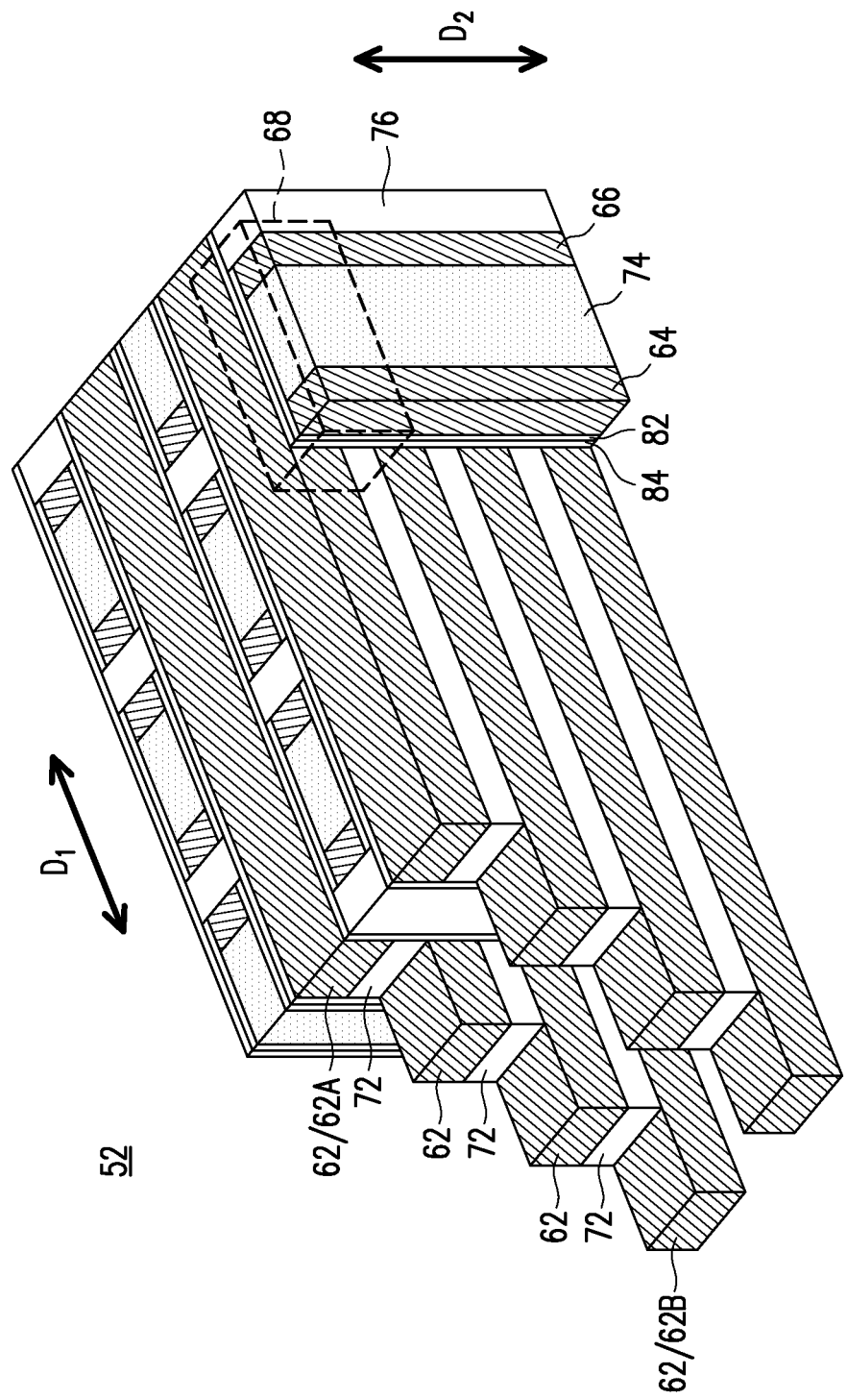

FIGS. 2A and 2B are various views of a memory array 52, in accordance with some embodiments. FIG. 2A is a circuit diagram of the memory array 52. FIG. 2B is a three-dimensional view of a portion of the memory array 52.

The memory array 52 is a flash memory array, such as a NOR flash memory array; a high speed memory array such as a DRAM or an SRAM; a non-volatile memory such as RRAM or MRAM, or the like. Each of the memory cells 58 is a flash memory cell that includes a thin film transistor (TFT) 68. The gate of each TFT 68 is electrically connected to a respective word line 62, a first source/drain region of each TFT 68 is electrically connected to a respective bit line 64, and a second source/drain region of each TFT 68 is electrically connected to a respective source line 66 (which are electrically connected to ground). The memory cells 58 in a same row of the memory array 52 share a common word line 62 while the memory cells in a same column of the memory array 52 share a common bit line 64 and a common source line 66.

The memory array 52 includes multiple arranged conductive lines (e.g., the word lines 62) with dielectric layers 72 located between adjacent ones of the word lines 62. The word lines 62 extend in a first direction $D_1$ that is parallel to a major surface of an underlying substrate (not shown in FIG. 2B, but discussed in greater detail below with respect to FIGS. 3A through 21B). The word lines 62 may have a staircase arrangement such that lower word lines 62 are longer than and extend laterally past endpoints of upper word lines 62. For example, in FIG. 2B, multiple, stacked layers of word lines 62 are illustrated with topmost word lines 62A being the shortest lines and bottommost word lines 62B being the longest lines. Respective lengths of the word lines 62 increases in a direction extending towards the underlying substrate. In this manner, a portion of each word line 62 may be accessible from above the memory array 52, so that conductive contacts may be formed to an exposed portion of each word line 62.

The memory array 52 further includes multiple arranged conductive lines such as the bit lines 64 and the source lines 66. The bit lines 64 and the source lines 66 extend in a second direction $D_2$ that is perpendicular to the first direction $D_1$ and the major surface of the underlying substrate. A dielectric layer 74 is disposed between and isolates adjacent ones of the bit lines 64 and the source lines 66. The boundaries of each memory cell 58 are defined by pairs of the bit lines 64 and the source lines 66 along with an intersecting word line 62. A dielectric plug 76 is disposed between and isolates adjacent pairs of the bit lines 64 and the source lines 66. Although FIGS. 2A and 2B illustrate a particular placement of the bit lines 64 relative to the source lines 66, it should be appreciated that the placement of the bit lines 64 and the source lines 66 may be flipped in other embodiments.

The memory array 52 further includes ferroelectric strips 84 and semiconductor strips 82. The ferroelectric strips 84 are in contact with the word lines 62. The semiconductor strips 82 are disposed between the ferroelectric strips 84 and the dielectric layer 74.

The semiconductor strips 82 provide channel regions for the TFTs 68 of the memory cells 58. For example, when an appropriate voltage (e.g., higher than a respective threshold voltage ($V_{th}$) of a corresponding TFT 68) is applied through a corresponding word line 62, a region of a semiconductor strip 82 that intersects the word line 62 may allow current to flow from the bit line 64 to the source lines 66 (e.g., in the direction $D_1$).

The ferroelectric strips 84 are data-storing layers that may be polarized in one of two different directions by applying an appropriate voltage differential across the ferroelectric strips 84. Depending on a polarization direction of a particular region of a ferroelectric strip 84, a threshold voltage of a corresponding TFT 68 varies and a digital value (e.g., 0 or 1) can be stored. For example, when a region of ferroelectric strip 84 has a first electrical polarization direction, the corresponding TFT 68 may have a relatively low threshold voltage, and when the region of the ferroelectric strip 84 has a second electrical polarization direction, the corresponding TFT 68 may have a relatively high threshold voltage. The difference between the two threshold voltages may be referred to as the threshold voltage shift. A larger threshold voltage shift makes it easier (e.g., less error prone) to read the digital value stored in the corresponding memory cell 58. Accordingly, the memory array 52 may also be referred to as a ferroelectric random access memory (FE-RAM) array.

To perform a write operation on a particular memory cell 58, a write voltage is applied across a region of the ferroelectric strip 84 corresponding to the memory cell 58. The write voltage can be applied, for example, by applying appropriate voltages to the word line 62, the bit line 64, and the source line 66 corresponding to the memory cell 58. By applying the write voltage across the region of the ferroelectric strip 84, a polarization direction of the region of the ferroelectric strip 84 can be changed. As a result, the corresponding threshold voltage of the corresponding TFT 68 can be switched from a low threshold voltage to a high threshold voltage (or vice versa), so that a digital value can be stored in the memory cell 58. Because the word lines 62 and the bit lines 64 intersect in the memory array 52, individual memory cells 58 may be selected and written to.

To perform a read operation on a particular memory cell 58, a read voltage (a voltage between the low and high threshold voltages) is applied to the word line 62 corresponding to the memory cell 58. Depending on the polarization direction of the corresponding region of the ferroelectric strip 84, the TFT 68 of the memory cell 58 may or may not be turned on. As a result, the bit line 64 may or may not be discharged (e.g., to ground) through the source line 66, so that the digital value stored in the memory cell 58 can be determined. Because the word lines 62 and the bit lines 64 intersect in the memory array 52, individual memory cells 58 may be selected and read from.

FIGS. 3A through 15B are various views of intermediate stages in the manufacturing of a memory array 52, in accordance with some embodiments. A portion of the memory array 52 is illustrated. Some features, such as the staircase arrangement of the word lines (see FIG. 2B), are not shown for clarity of illustration. FIGS. 3A, 4A, 5A, 6A, 7A, 8A, 9A, 10A, 11A, 12A, 13A, 14A, and 15A are three-dimensional views of the memory array 52. FIGS. 3B, 4B, 5B, 6B, 7B, 8B, 9B, 10B, 11B, 12B, 13B, 14B, and 15B are a cross-sectional views shown along reference cross-section B-B in FIG. 12A.

Figure 3B:
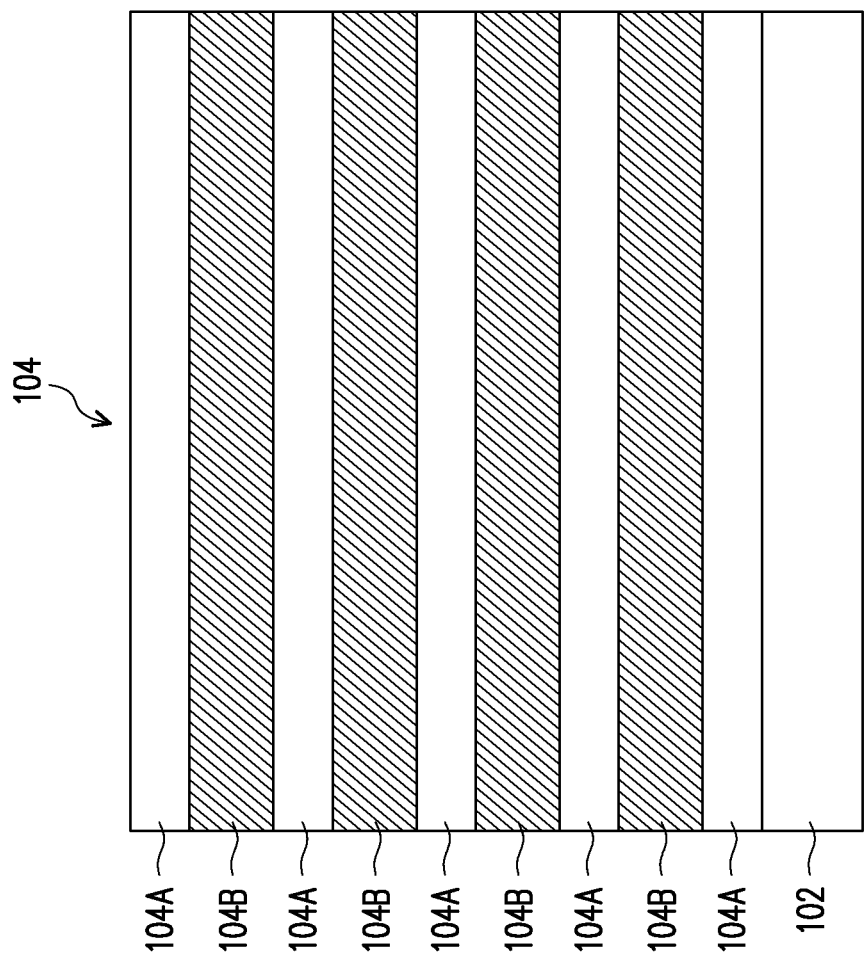
FIGS. 3A through 13D are various views of intermediate stages in the manufacturing of a memory array, in accordance with some embodiments.

In FIGS. 3A and 3B, a substrate 102 is provided. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multilayered or gradient substrate may also be used. In some embodiments, the semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. The substrate 102 may include a dielectric material. For example, the substrate 102 may be a dielectric substrate, or may include a dielectric layer on a semiconductor substrate. Acceptable dielectric materials for dielectric substrates include oxides such as silicon oxide; nitrides such as silicon nitride; carbides such as silicon carbide; the like; or combinations thereof such as silicon oxynitride, silicon oxycarbide, silicon carbonitride, or the like. In some embodiments, the substrate 102 is formed of silicon carbide.

A multilayer stack 104 is formed over the substrate 102. The multilayer stack 104 includes alternating first dielectric layers 104A and second dielectric layers 104B. The first dielectric layers 104A are formed of a first dielectric material, and the second dielectric layers 104B are formed of a second dielectric material. The dielectric materials may each be selected from the candidate dielectric materials of the substrate 102. In the illustrated embodiment, the multilayer stack 104 includes five layers of the first dielectric layers 104A and four layers of the second dielectric layers 104B. It should be appreciated that the multilayer stack 104 may include any number of the first dielectric layers 104A and the second dielectric layers 104B.

The multilayer stack 104 will be patterned in subsequent processing. As such, the dielectric materials of the first dielectric layers 104A and the second dielectric layers 104B both have a high etching selectivity from the etching of the substrate 102. The patterned first dielectric layers 104A will be used to isolate subsequently formed TFTs. The patterned second dielectric layers 104B are sacrificial layers (or dummy layers), which will be removed in subsequent processing and replaced with word lines for the TFTs. As such, the second dielectric material of the second dielectric layers 104B also has a high etching selectivity from the etching of the first dielectric material of the first dielectric layers 104A. In embodiments where the substrate 102 is formed of silicon carbide, the first dielectric layers 104A can be formed of an oxide such as silicon oxide, and the second dielectric layers 104B can be formed of a nitride such as silicon nitride. Other combinations of dielectric materials having acceptable etching selectivity from one another may also be used.

Each layer of the multilayer stack 104 may be formed by an acceptable deposition process such as chemical vapor deposition (CVD), atomic layer deposition (ALD), or the like. A thickness of each of the layers may be in the range of about 15 nm to about 90 nm. In some embodiments, the first dielectric layers 104A are formed to a different thickness than the second dielectric layers 104B. For example, the first dielectric layers 104A can be formed to a first thickness $T_1$ and the second dielectric layers 104B can be formed to a second thickness $T_2$, with the second thickness $T_2$ being from about 0% to about 100% less than the first thickness $T_1$. The multilayer stack 104 can have an overall height $H_1$ in the range of about 1000 nm to about 10000 nm (such as about 2000 nm).

As will be discussed in greater detail below, FIGS. 4A through 11B illustrate a process in which trenches are patterned in the multilayer stack 104 and TFTs are formed in the trenches. Specifically, a multiple-patterning process is used to form the TFTs. The multiple-patterning process may be a double patterning process, a quadruple patterning process, or the like. FIGS. 4A through 11B illustrate a double patterning process. In a double patterning process, first trenches 106 (see FIGS. 4A and 4B) are patterned in the multilayer stack 104 with a first etching process, and components for a first subset of the TFTs are formed in the first trenches 106. Second trenches 120 (see FIGS. 8A and 8B) are then patterned in the multilayer stack 104 with a second etching process, and a second subset of the TFTs are formed in the second trenches 120. Forming the TFTs with a multiple-patterning process allows each patterning process to be performed with a low pattern density, which can help reduce defects while still allowing the memory array 52 to have sufficient memory cell density, while also helping to prevent the aspect ratio from becoming too high and causing problems with structural instability.

Additionally, while the embodiment discussed above illustrates the memory array 52 being formed directly over the substrate 102 (e.g., a semiconductor substrate) in a front end of line process, this is intended to be illustrative and is not intended to be limiting upon the embodiments. Rather, the memory array 52 may be formed in either a front end of line process or a back end of line process, and may be formed either as an embedded memory array or as a stand-alone structure. Any suitable formation of the memory array 52 may be utilized, and all such formations are fully intended to be included within the scope of the embodiments.

Figure 4A:
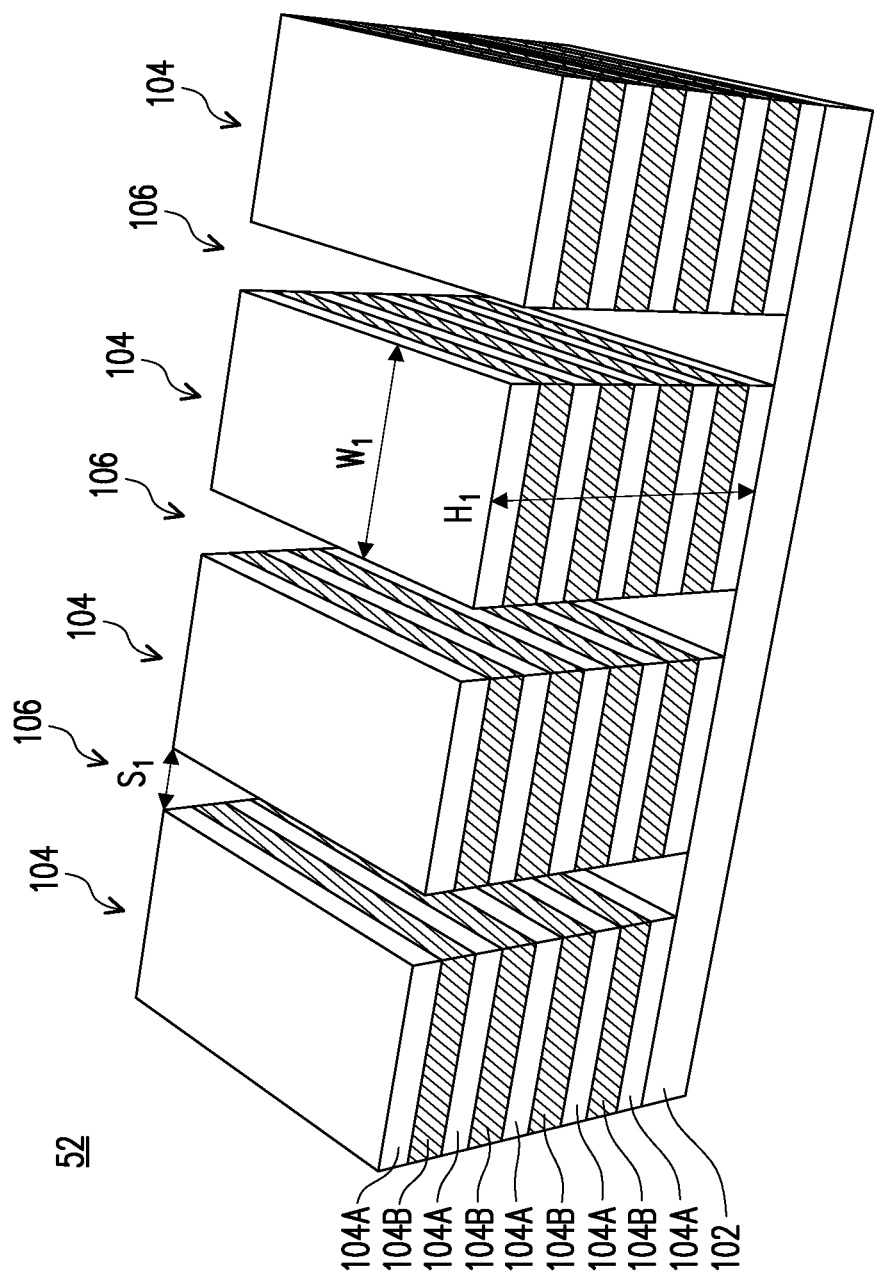
Figure 4B:
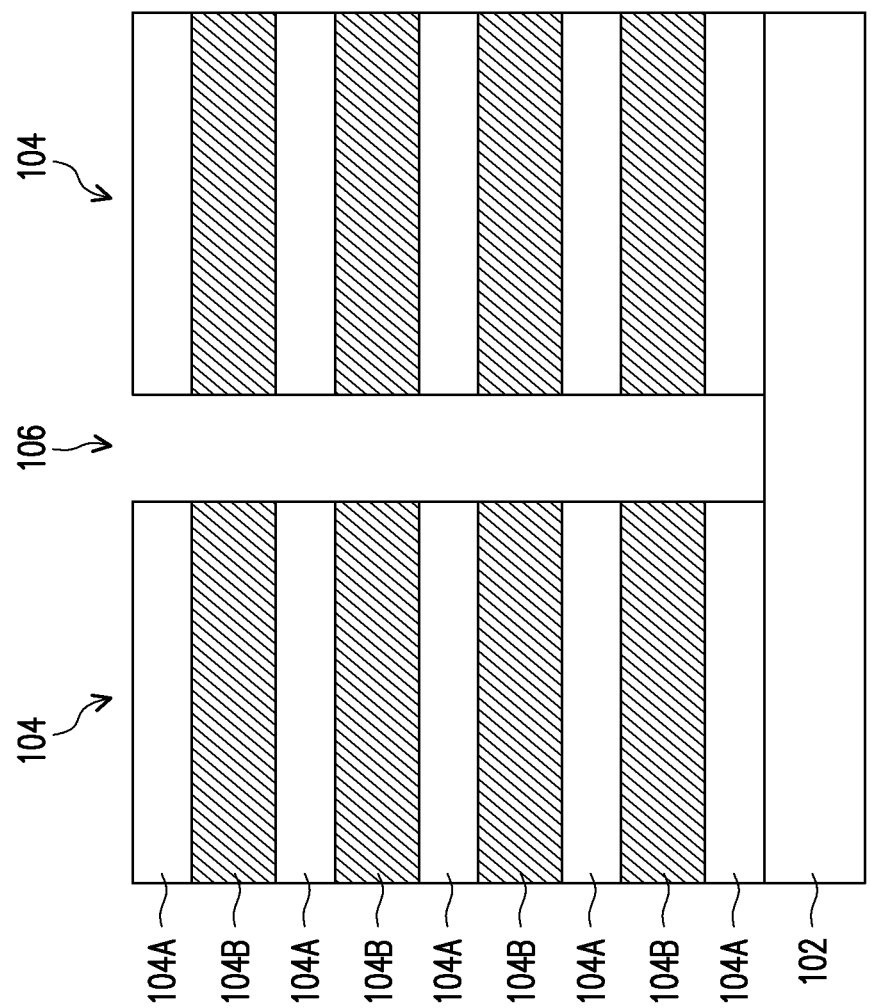

In FIGS. 4A and 4B, first trenches 106 are formed in the multilayer stack 104. In the illustrated embodiment, the first trenches 106 extend through the multilayer stack 104 and expose the substrate 102. In another embodiment, the first trenches 106 extend through some but not all layers of the multilayer stack 104. The first trenches 106 may be formed using acceptable photolithography and etching techniques, such as with an etching process that is selective to the multilayer stack 104 (e.g., etches the dielectric materials of the first dielectric layers 104A and the second dielectric layers 104B at a faster rate than the material of the substrate 102). The etching may be any acceptable etch process, such as a reactive ion etch (RIE), neutral beam etch (NBE), the like, or a combination thereof. The etching may be anisotropic. In embodiments where the substrate 102 is formed of silicon carbide, the first dielectric layers 104A are formed of silicon oxide, and the second dielectric layers 104B are formed of silicon nitride, the first trenches 106 can be formed by a dry etch using a fluorine-based gas (e.g., $C_4F_6$) mixed with hydrogen ($H_2$) or oxygen ($O_2$) gas.

A portion of the multilayer stack 104 is disposed between each pair of the first trenches 106. Each portion of the multilayer stack 104 can have a width $W_1$ in the range of about 50 nm to about 500 nm (such as about 240 nm), and has the height $H_1$ discussed with respect to FIGS. 3A and 3B. Further, each portion of the multilayer stack 104 is separated by a separation distance $S_1$, which can be in the range of about 50 nm and about 200 nm (such as about 80 nm). The aspect ratio (AR) of each portion of the multilayer stack 104 is the ratio of the height $H_1$ to the width of the narrowest feature of the portion of the multilayer stack 104, which is the width $W_1$ at this step of processing. In accordance with some embodiments, when the first trenches 106 are formed, the aspect ratio of each portion of the multilayer stack 104 is in the range of about 5 to about 15. Forming each portion of the multilayer stack 104 with an aspect ratio of less than about 5 may not allow the memory array 52 to have sufficient memory cell density. Forming each portion of the multilayer stack 104 with an aspect ratio of greater than about 15 may cause twisting or collapsing of the multilayer stack 104 in subsequent processing.

Figure 5A:
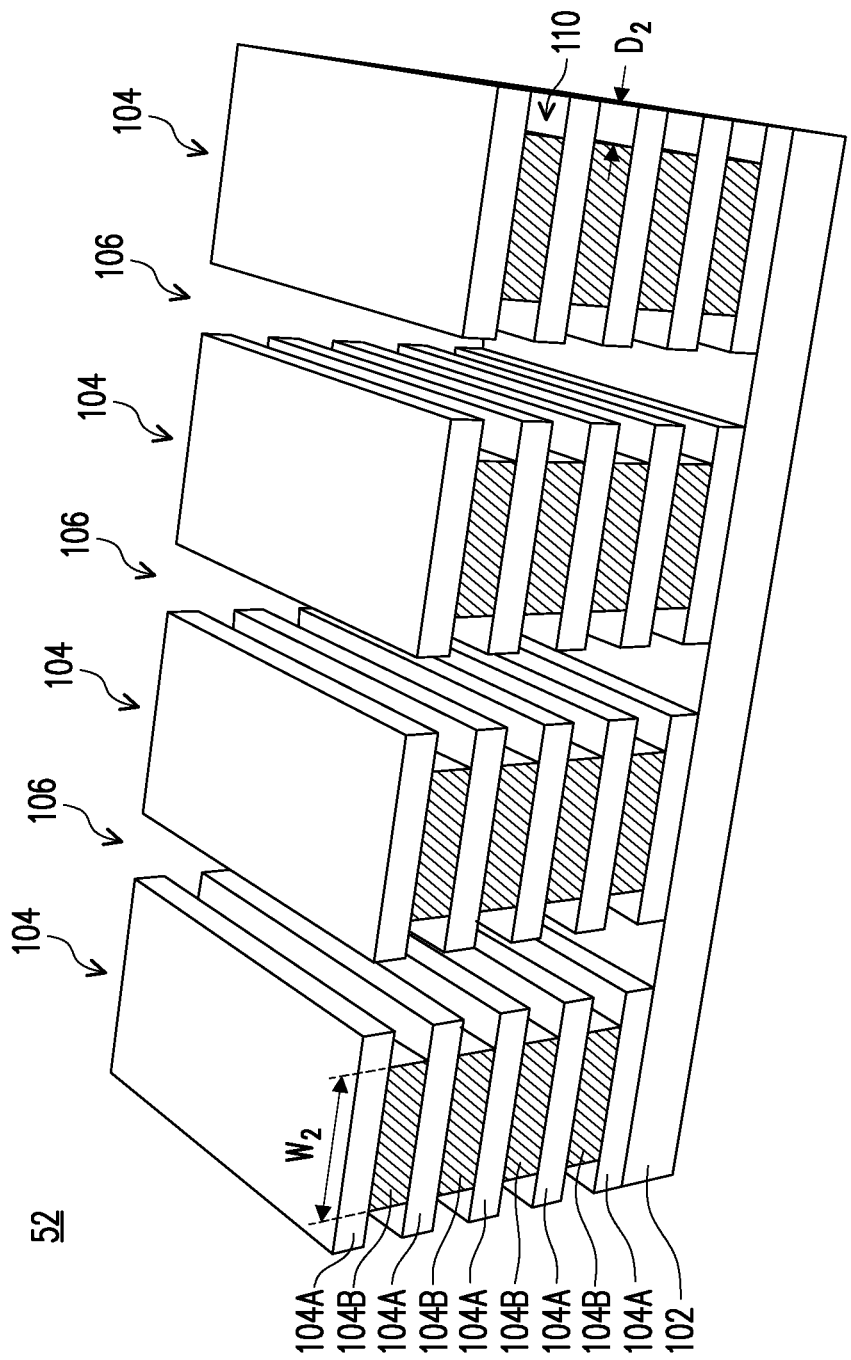
Figure 5B:
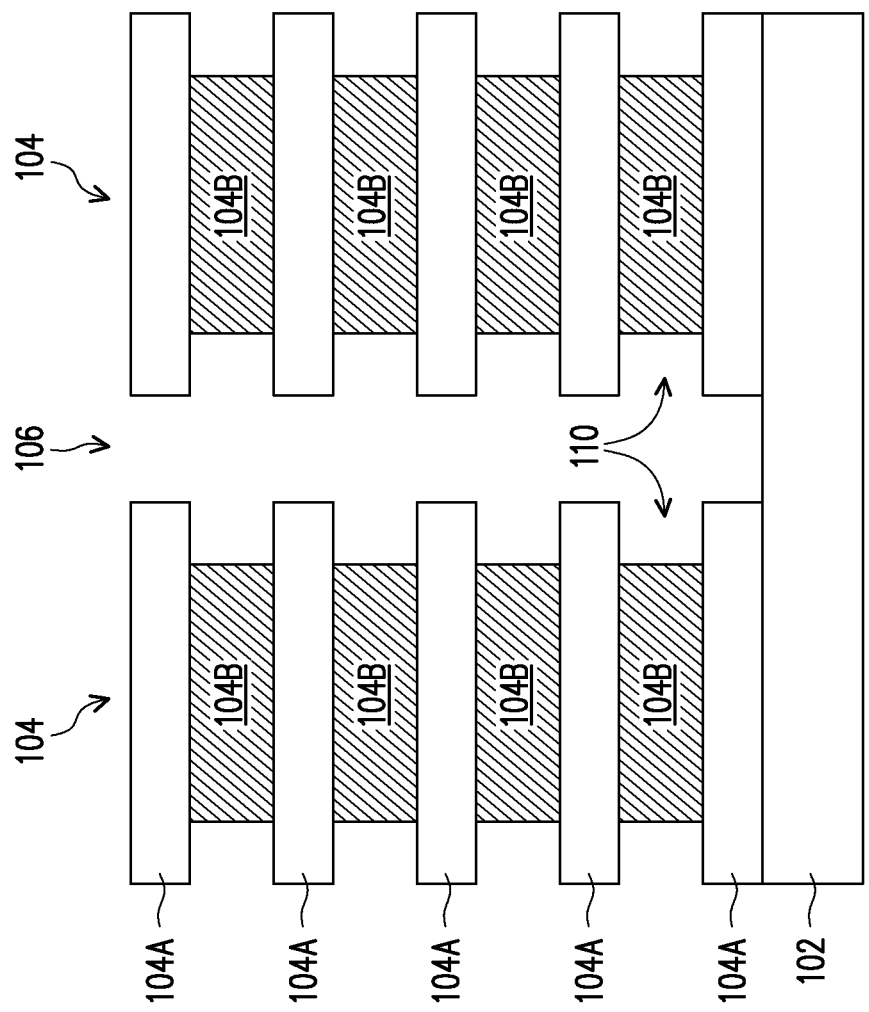

In FIGS. 5A and 5B, the first trenches 106 are expanded to form first sidewall recesses 110. Specifically, portions of the sidewalls of the second dielectric layers 104B exposed by the first trenches 106 are recessed from the first sidewall recesses 110. Although sidewalls of the second dielectric layers 104B are illustrated as being straight, the sidewalls may be concave or convex. The first sidewall recesses 110 may be formed by an acceptable etching process, such as one that is selective to the material of the second dielectric layers 104B (e.g., selectively etches the material of the second dielectric layers 104B at a faster rate than the materials of the first dielectric layers 104A and the substrate 102). The etching may be isotropic. In embodiments where the substrate 102 is formed of silicon carbide, the first dielectric layers 104A are formed of silicon oxide, and the second dielectric layers 104B are formed of silicon nitride, the first trenches 106 can be expanded by a wet etch using phosphoric acid ($H_3PO_4$). However, any suitable etching process, such as a dry selective etch, may also be utilized.

After formation, the first sidewall recesses 110 have a depth $D_3$ extending past the sidewalls of the first dielectric layers 104A. Timed etch processes may be used to stop the etching of the first sidewall recesses 110 after the first sidewall recesses 110 reach a desired depth $D_3$. For example, when phosphoric acid is used to etch the second dielectric layers 104B, it can cause the first sidewall recesses 110 to have a depth $D_3$ in the range of about 10 nm to about 60 nm (such as about 40 nm). Forming the first sidewall recesses 110 reduces the width of the second dielectric layers 104B. Continuing the previous example, the second dielectric layers 104B can have a width $W_2$ in the range of about 50 nm to about 450 nm (such as about 160 nm) after the etching. As noted above, the aspect ratio (AR) of each portion of the multilayer stack 104 is the ratio of the height $H_1$ to the width of the narrowest feature of the portion of the multilayer stack 104, which is the width $W_2$ at this step of processing. Forming the first sidewall recesses 110 thus increases the aspect ratio of each portion of the multilayer stack 104. In accordance with some embodiments, after forming the first sidewall recesses 110, the aspect ratio of each portion of the multilayer stack 104 remains in the range discussed above, e.g., the range of about 5 to about 15. The advantages of such an aspect ratio (discussed above) may thus still be achieved.

Figure 6A:
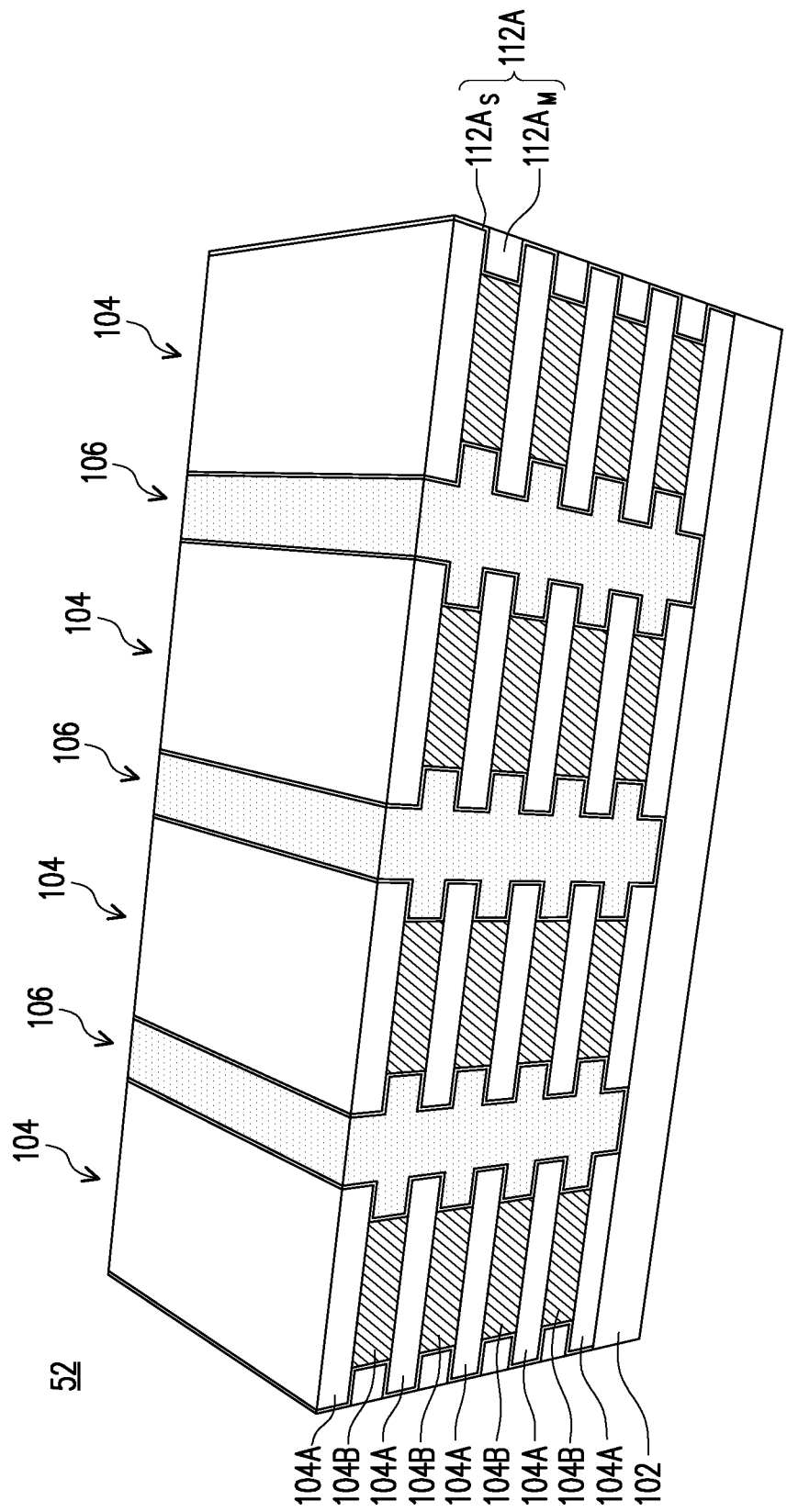
Figure 6B:
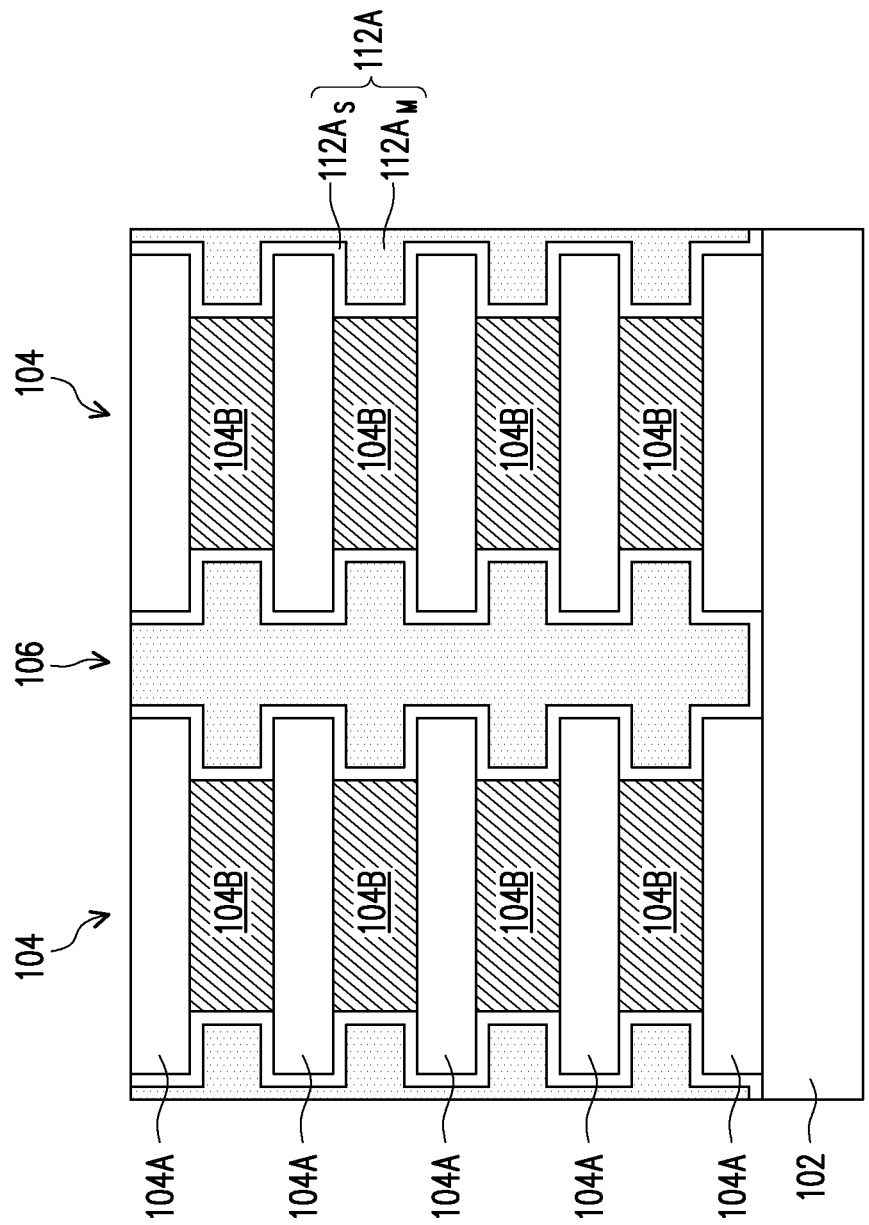

In FIGS. 6A and 6B, first conductive features 112A are formed in the first sidewall recesses 110 and to fill and/or overfill the first trenches 106, thus completing a process for replacing first portions of the second dielectric layers 104B. The first conductive features 112A may each comprise one or more layers, such as seed layers, glue layers, barrier layers, diffusion layers, and fill layers, and the like. In some embodiments, the first conductive features 112A each include a seed layer $112A_S$ (or glue layer) and a main layer $112A_M$, although in other embodiments the seed layer $112A_S$ may be omitted. Each seed layer $112A_S$ extends along three sides (e.g., the top surface, a sidewall, and the bottom surface) of the material of a corresponding main layer $112A_M$ located within the first sidewall recesses 110. The seed layer $112A_S$ are formed of a first conductive material that can be utilized to help grow or to help adhere the subsequently deposited material, such as titanium nitride, tantalum nitride, titanium, tantalum, molybdenum, ruthenium, rhodium, hafnium, iridium, niobium, rhenium, tungsten, combinations of these, oxides of these, or the like. The main layers $112A_M$ may be formed of a second conductive material, such as a metal, such as tungsten, cobalt, aluminum, nickel, copper, silver, gold, molybdenum, ruthenium, molybdenum nitride, alloys thereof, or the like. The material of the seed layer $112A_S$ is one that has good adhesion to the material of the first dielectric layers 104A, and the material of the main layers $112A_M$ is one that has good adhesion to the material of the seed layer $112A_S$. In embodiments where the first dielectric layers 104A are formed of an oxide such as silicon oxide, the seed layer $112A_S$ can be formed of titanium nitride and the main layers $112A_M$ can be formed of tungsten. The seed layer $112A_S$ and main layers $112A_M$ may each be formed by an acceptable deposition process such as chemical vapor deposition (CVD), atomic layer deposition (ALD), or the like.

Once the first conductive features 112A have been deposited in order to fill and/or overfill the first trenches 106, the first conductive features 112A may be planarized to remove excess material outside of the first trenches 106, such that after the planarizing the first conductive features 112A the first conductive features 112A completely span a top portion of the first trenches 106. In an embodiment the first conductive features 112A may be planarized using, e.g., a chemical mechanical planarization (CMP) process. However, any suitable planarization process, such as a grinding process, may also be utilized.

Figure 7A:
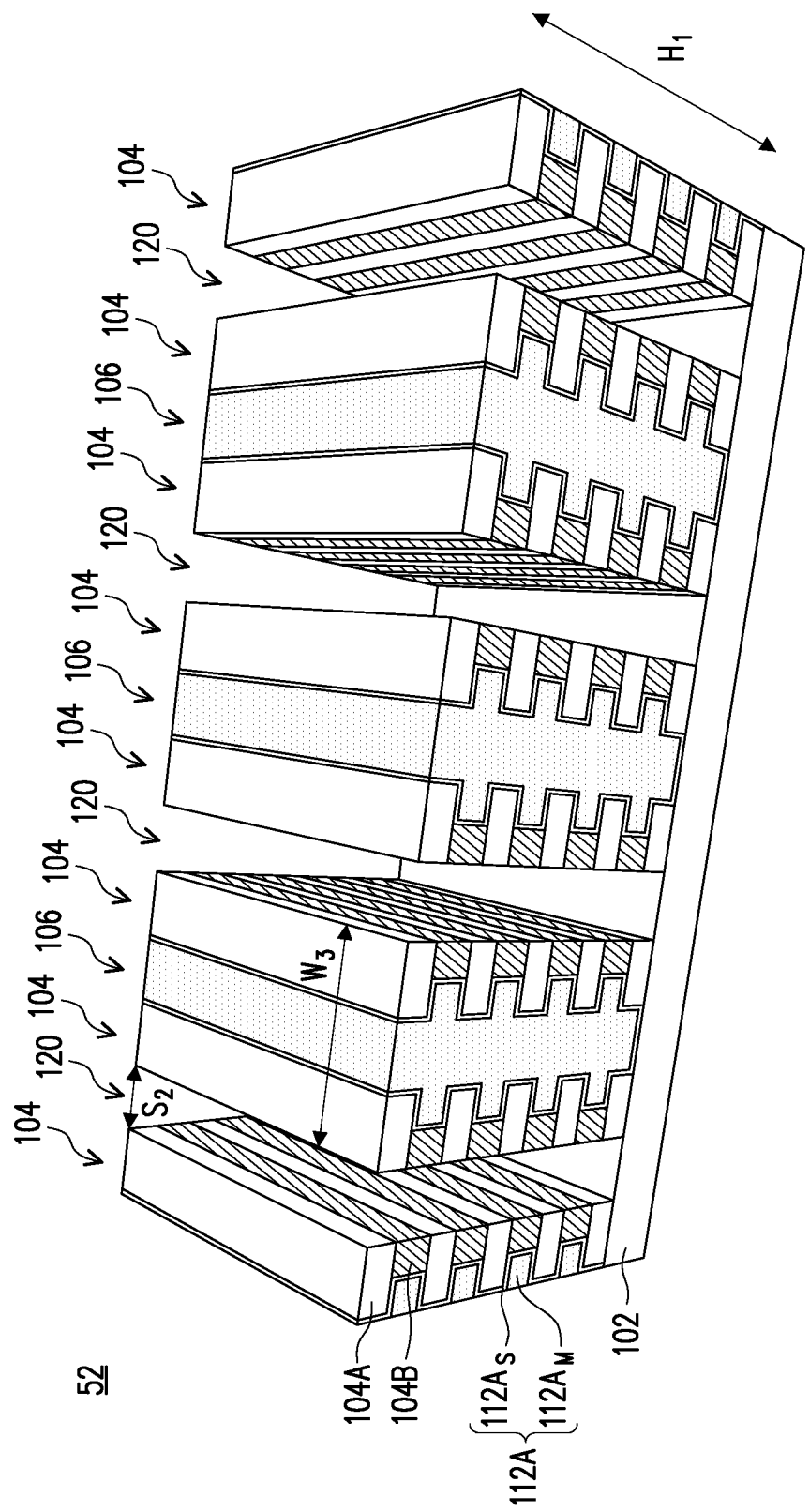
Figure 7B:
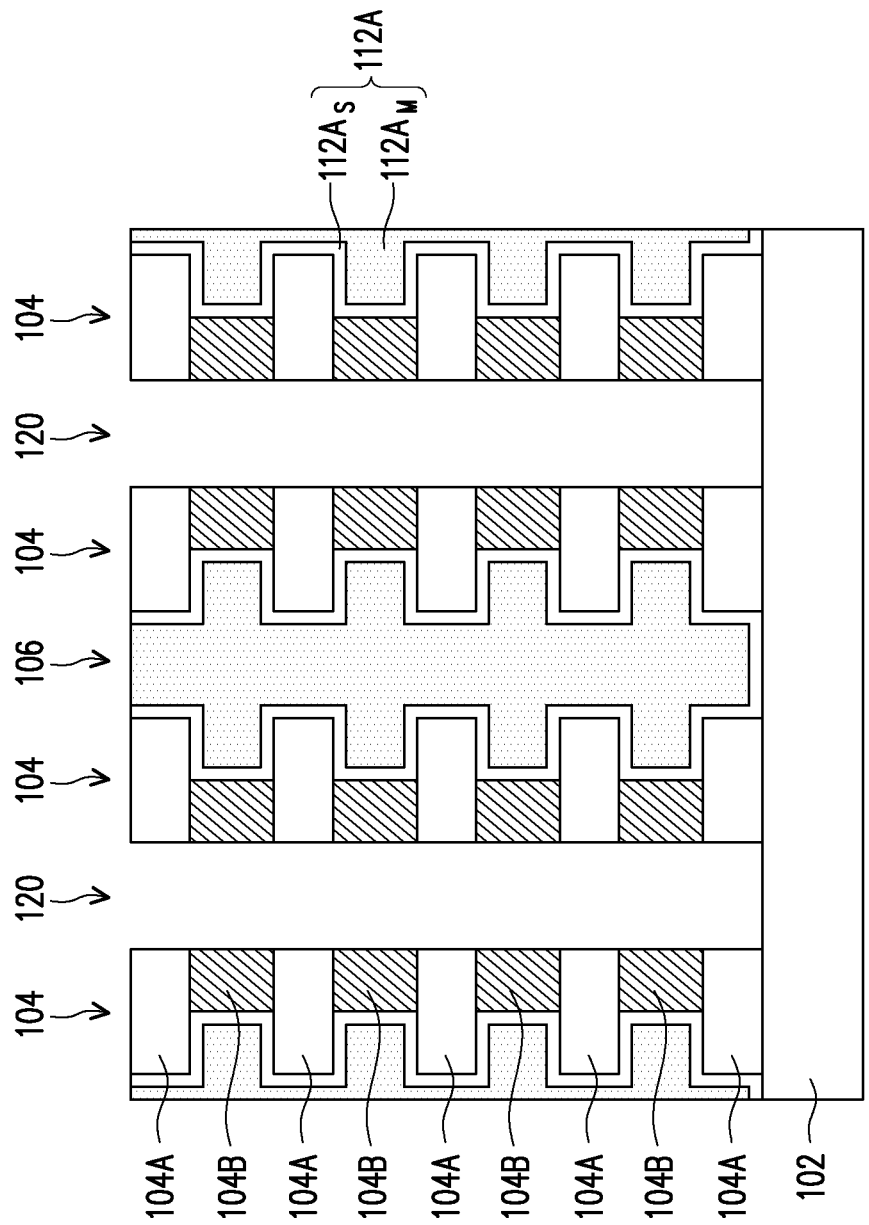

In FIGS. 7A and 7B, second trenches 120 are formed in the multilayer stack 104. In the illustrated embodiment, the second trenches 120 extend through the multilayer stack 104 and expose the substrate 102. In another embodiment, the second trenches 120 extend through some but not all layers of the multilayer stack 104. The second trenches 120 may be formed using acceptable photolithography and etching techniques, such as with an etching process that is selective to the multilayer stack 104 (e.g., etches the dielectric materials of the first dielectric layers 104A and the second dielectric layers 104B at a faster rate than the material of the substrate 102). The etching may be any acceptable etch process, and in some embodiments, may be similar to the etch used to form the first trenches 106 discussed with respect to FIGS. 4A and 4B.

A portion of the multilayer stack 104 is disposed between each second trench 120 and first trench 106. Each portion of the multilayer stack 104 can have a width $W_3$ in the range of about 50 nm to about 500 nm, and has the height $H_1$ discussed with respect to FIGS. 3A and 3B. Further, each portion of the multilayer stack 104 is separated by a separation distance $S_2$, which can be in the range of about 50 nm to about 200 nm. The aspect ratio (AR) of each portion of the multilayer stack 104 is the ratio of the height $H_1$ to the width of the narrowest feature of the portion of the multilayer stack 104, which is the width $W_3$ at this step of processing. In accordance with some embodiment, when the second trenches 120 are formed, the aspect ratio of each portion of the multilayer stack 104 is in the range of about 5 to about 15. Forming each portion of the multilayer stack 104 with an aspect ratio of less than about 5 may not allow the memory array 52 to have sufficient memory cell density. Forming each portion of the multilayer stack 104 with an aspect ratio of greater than about 15 may cause twisting or collapsing of the multilayer stack 104 in subsequent processing.

Figure 8A:
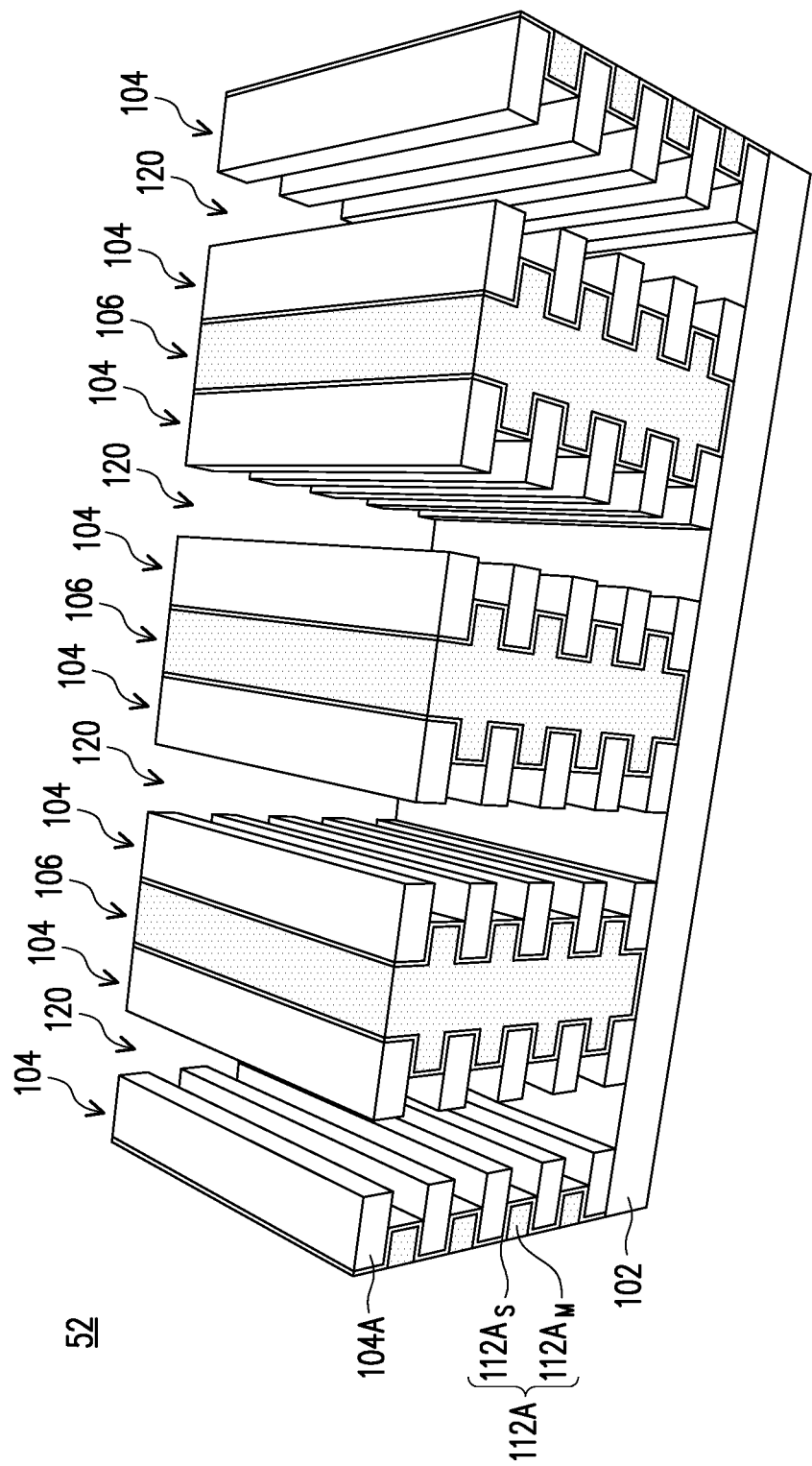
Figure 8B:
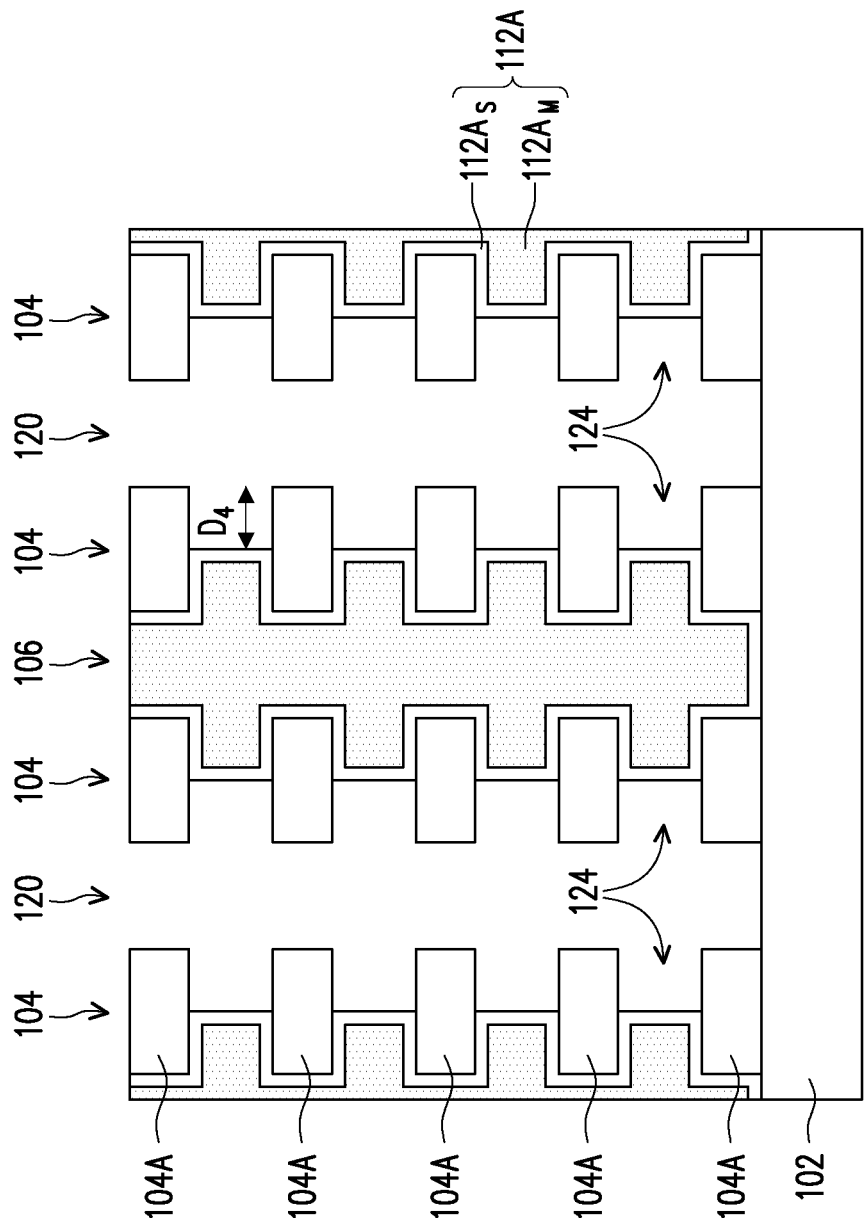

In FIGS. 8A and 8B, the second trenches 120 are expanded to form second sidewall recesses 124. Specifically, the remaining portions of the second dielectric layers 104B are removed to form the second sidewall recesses 124. The second sidewall recesses 124 thus expose portions of the first conductive features 112A, e.g., the seed layer $112A_S$, or, in embodiments in which the seed layer $112A_S$ are not present, the main layers $112A_M$. The second sidewall recesses 124 may be formed by an acceptable etching process, such as one that is selective to the material of the second dielectric layers 104B (e.g., selectively etches the material of the second dielectric layers 104B at a faster rate than the materials of the first dielectric layers 104A and the substrate 102). The etching may be any acceptable etch process, and in some embodiments, may be similar to the etch used to form the first sidewall recesses 110 discussed with respect to FIGS. 5A and 5B. After formation, the second sidewall recesses 124 have a depth $D_4$ extending past the sidewalls of the first dielectric layers 104A. In some embodiments, the depth $D_4$ is similar to the depth $D_3$ discussed with respect to FIGS. 5A and 5B. In another embodiment, the depth $D_4$ is different from (e.g., greater than or less than) the depth $D_3$ discussed with respect to FIGS. 5A and 5B.

Figure 9A:
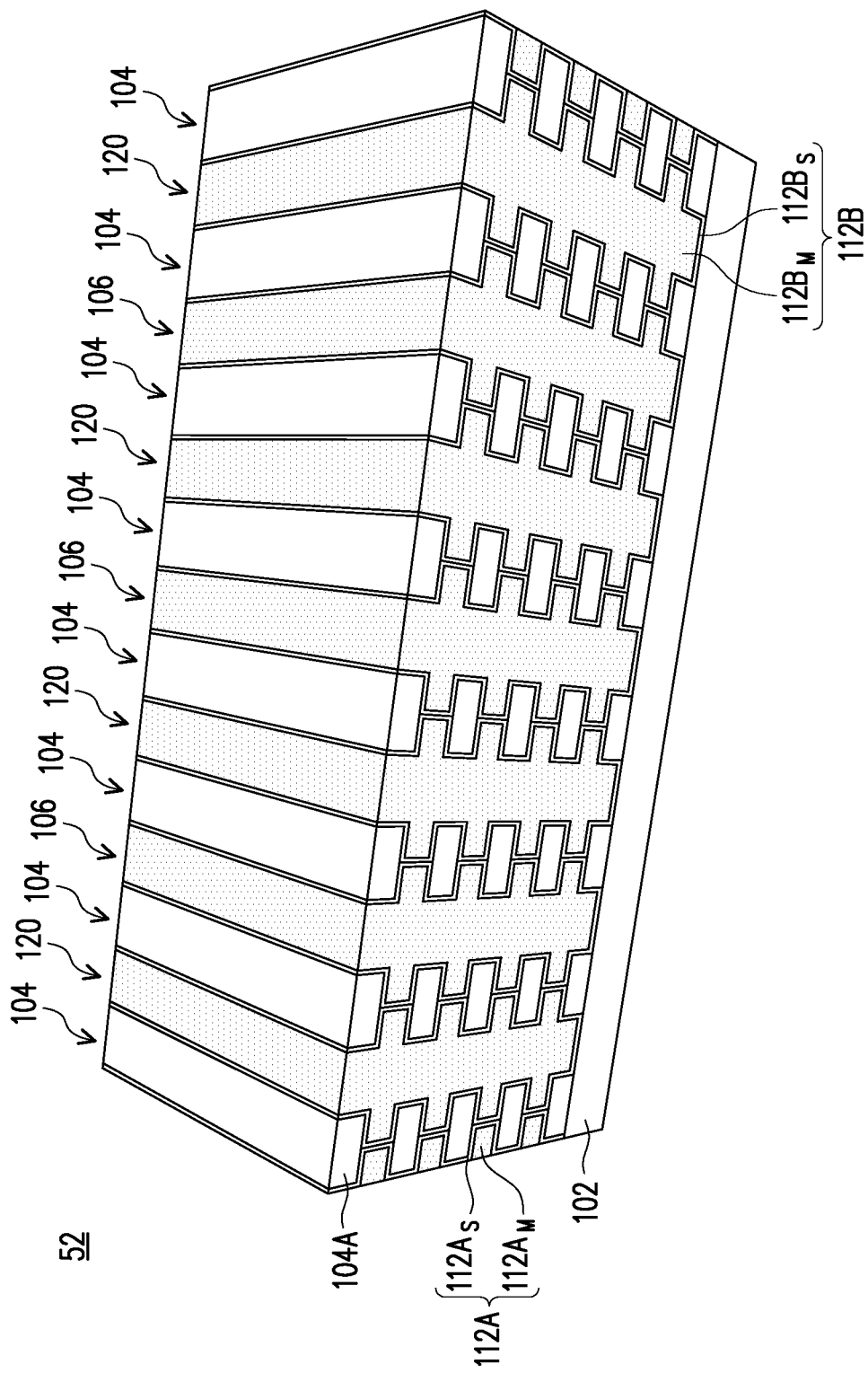
Figure 9B:
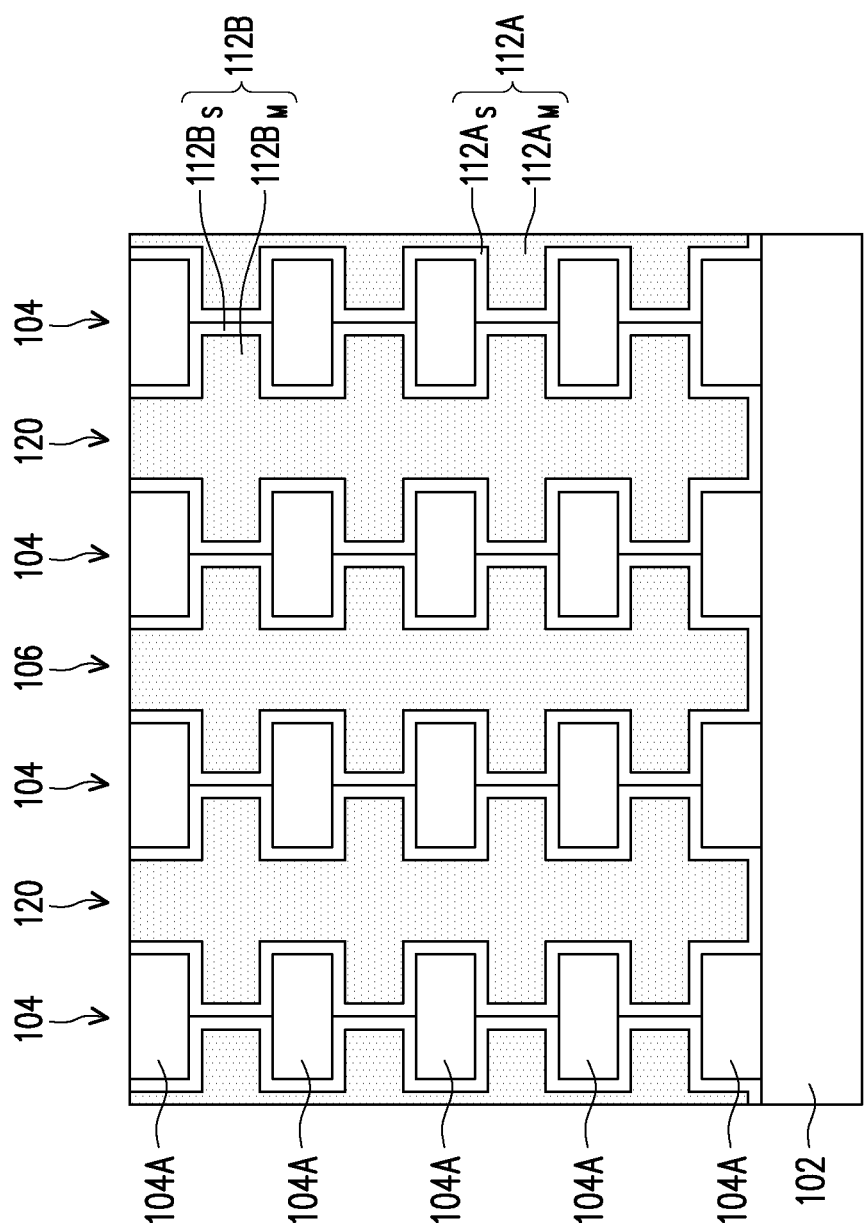

In FIGS. 9A and 9B, second conductive features 112B are formed in the second sidewall recesses 124 and to fill and/or overfill the second trenches 120, thus completing a process for replacing second portions of the second dielectric layers 104B which results in the internals layers of the first conductive features 112A and the second conductive features 112B (e.g., glue layers or seed layers) to be buried within the word line 112. The second conductive features 112B may be formed of materials that are selected from the same group of candidate materials of the first conductive features 112A, and may be formed using methods that are selected from the same group of candidate methods for forming the materials of the first conductive features 112A. The first conductive features 112A and the second conductive features 112B may be formed from the same material, or may include different materials. In some embodiments, the second conductive features 112B each include a seed layer $112B_S$ and a main layer $112B_M$, although in other embodiments the seed layer $112B_S$ may be omitted. The seed layer $112B_S$ and the main layers $112B_M$ of the second conductive features 112B can have similar thicknesses as the seed layer $112A_S$ and the main layers $112A_M$ of the first conductive features 112A, respectively. In some embodiments, the seed layer $112A_S$ and the seed layer $112B_S$ are formed of similar materials, in which case the seed layer $112A_S$ and the seed layer $112B_S$ may merge during formation such that no discernable interfaces exist between them. In another embodiment (discussed further below), the seed layer $112A_S$ and the seed layer $112B_S$ are formed of different materials, in which case the seed layer $112A_S$ and the seed layer $112B_S$ may not merge during formation such that discernable interfaces exist between them.

Once the second conductive features 112B have been deposited in order to fill and/or overfill the second trenches 120, the second conductive features 112B may be planarized to remove excess material outside of the second trenches 120, such that after the planarizing the second conductive features 112B the second conductive features 112B completely span a top portion of the second trenches 120. In an embodiment the second conductive features 112B may be planarized using, e.g., a chemical mechanical planarization (CMP) process. However, any suitable planarization process, such as a grinding process, may also be utilized.

The first conductive features 112A and the second conductive features 112B are collectively referred to as word lines 112 of the memory array 52. Adjacent pairs of the first conductive features 112A and the second conductive features 112B are in physical contact with one another and are electrically coupled to one another. Thus, each pair of a first conductive feature 112A and a second conductive feature 112B functions as a single word line 112.

Figure 10A:
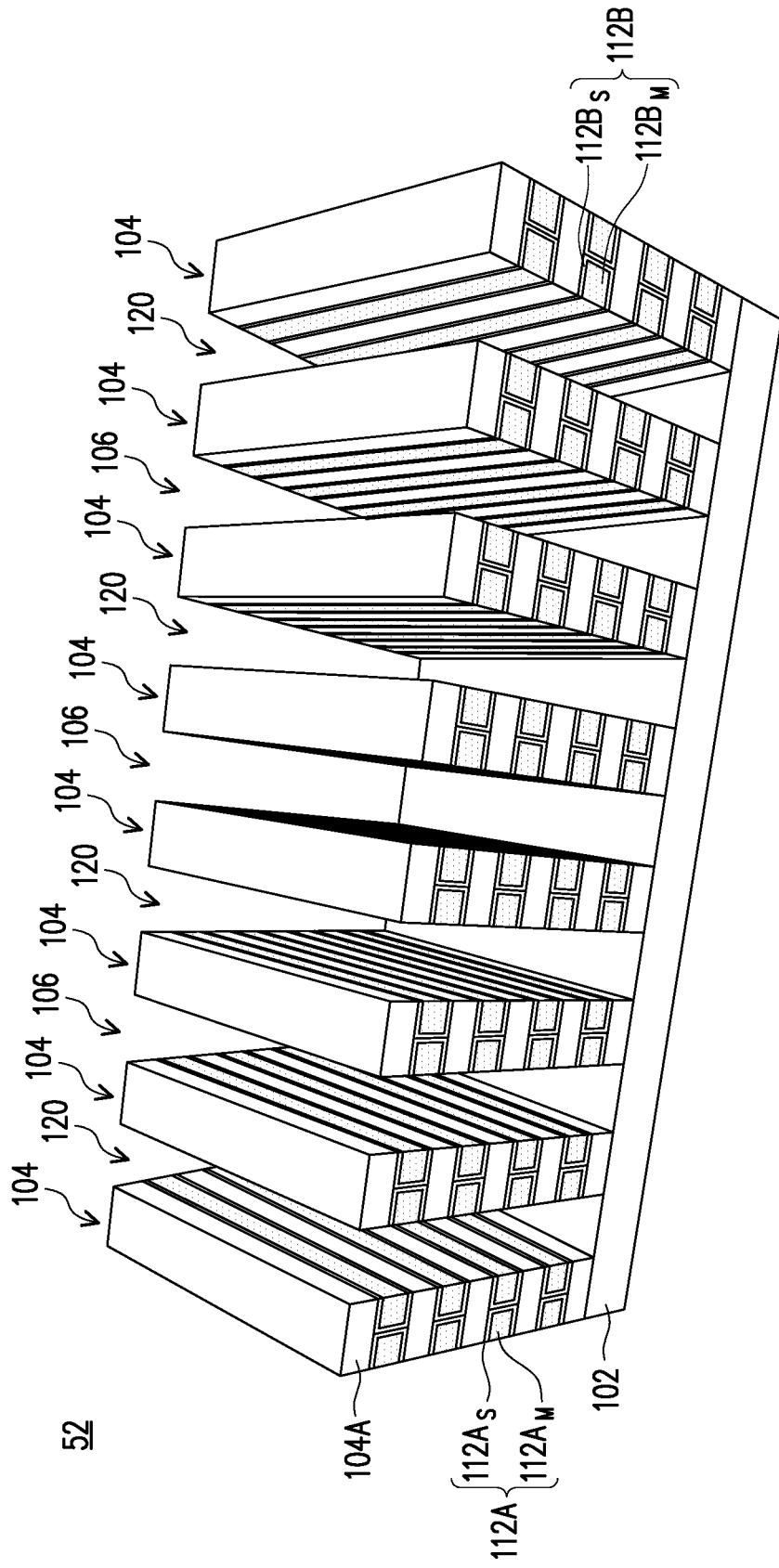

FIGS. 10A-10B illustrate an etch back process in order to remove excess portions of the first conductive features 112A and the second conductive features 112B and to expose the second dielectric layers 104B. In an embodiment the etch back process may be performed using, e.g., an anisotropic etching process. However, any suitable etching process may be utilized.

In an embodiment the etch back process is performed until the material of the first conductive features 112A and the second conductive features 112B that are not covered by the first dielectric layers 104A have been removed. As such, the remaining material of the first conductive features 112A and the second conductive features 112B has a similar width as the remaining portion of the first dielectric layers 104A (e.g., 80 nm). However, any suitable dimension may be utilized.

Additionally, as can be clearly seen in FIG. 10B, the first conductive feature 112A and the second conductive feature 112B within the word line 112 may have equal widths with each other, such as about 40 nm apiece. Additionally, the seed layers (e.g., the seed layer $112A_S$ and $112B_S$) may have an "H"-shape and also have a thickness $T_3$ along the top and bottom of the first conductive features 112A and the second conductive features 112B, and a thickness $T_4$ buried within the word line 112, wherein the seed layer $112A_S$ and $112B_S$ merge so that each of the seed layer $112A_S$ and $112B_S$ contribute to the thickness. In an embodiment the thickness $T_3$ may be between about 1 Å and about 100 Å, while the thickness $T_4$ may be between about 2 Å and about 200 Å. However, any suitable thicknesses may be utilized.

Figure 10C:
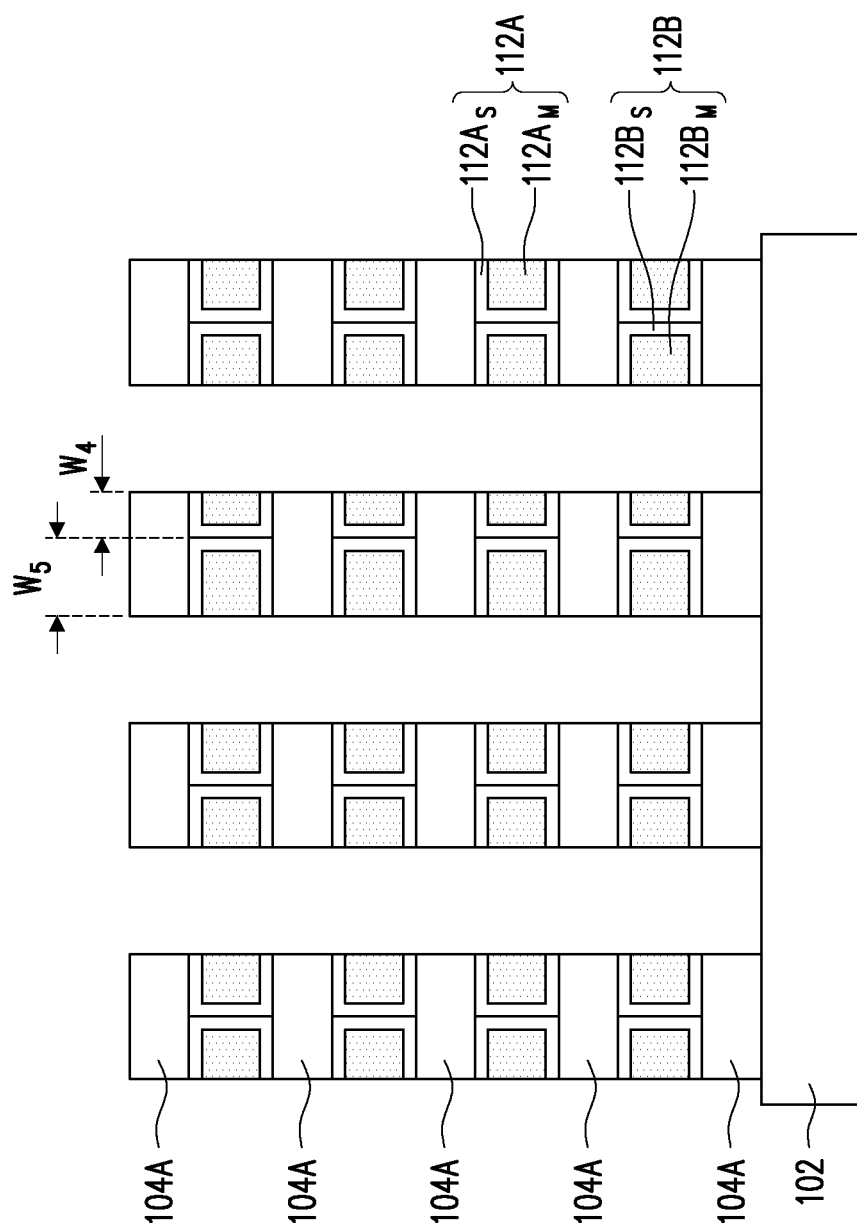

FIG. 10C illustrates another embodiment in which the first conductive feature 112A within the word line 112 may have a different width than the second conductive feature 112B within the word line 112. For example, in an embodiment the second trench 120 may be formed offset from a mid-point between two of the first trenches 106 (e.g., by an intentional mis-alignment of the masks). As such, while the word line 112 may have the overall same width, the second sidewall recesses 124 may have a larger width than the first sidewall recesses 110, which causes the second conductive features 112B within the word line 112 to have a larger width than the first conductive features 112A. For example, the first conductive features 112A may have a width $W_4$ of between about 10 Å and about 500 Å, while the second conductive features 112B may have a larger width $W_5$ of between about 15 Å and about 1000 Å. However, any suitable widths may be utilized.

Figure 11A:
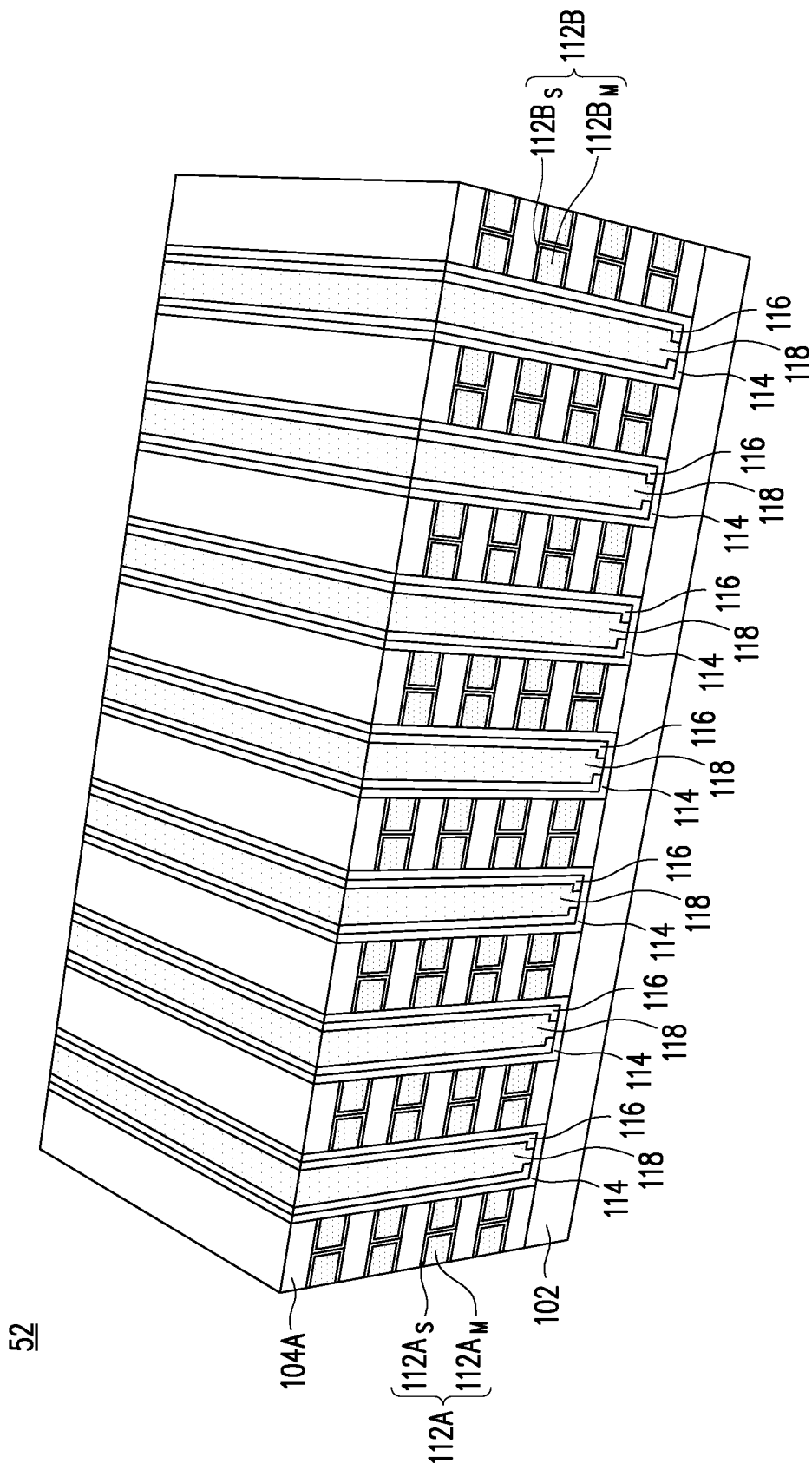
Figure 11B:
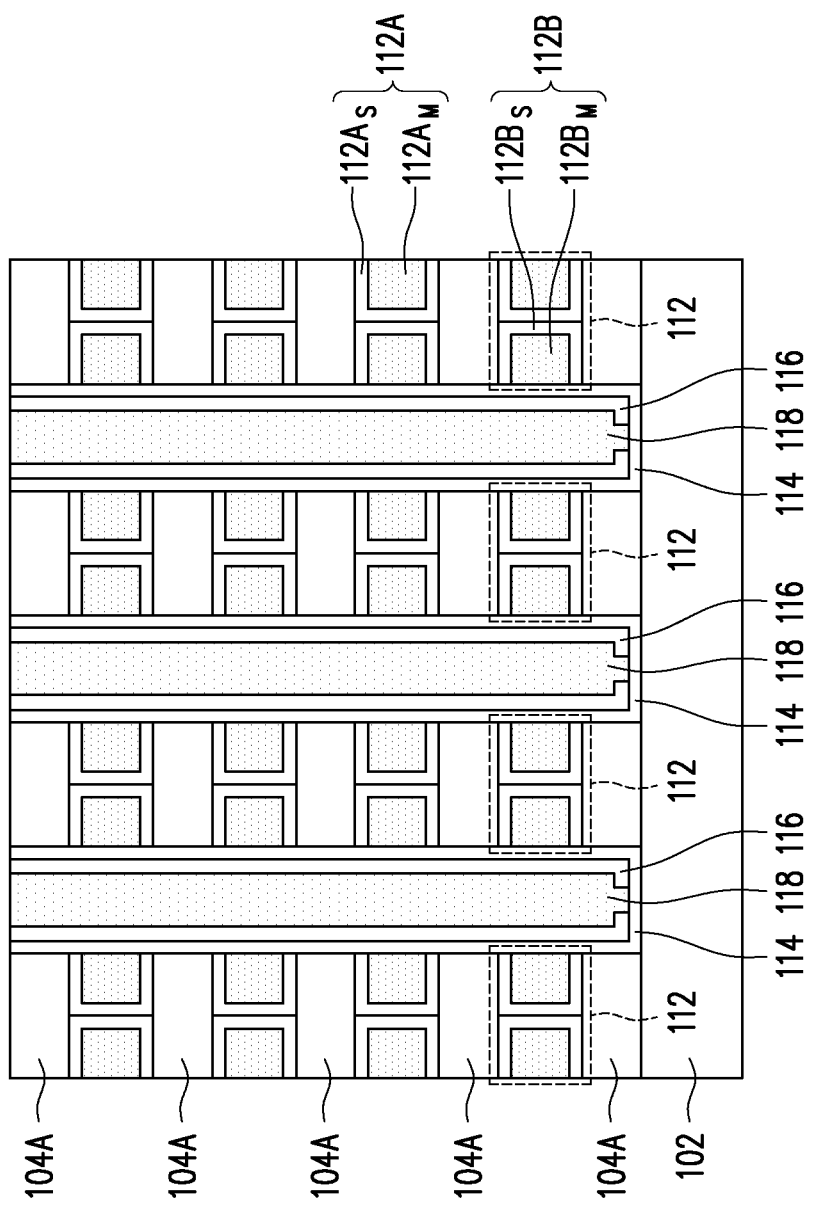

FIGS. 11A-11B illustrate TFT film stacks are formed in the first trenches 106 and the second trenches 120. Specifically, two ferroelectric strips 114, a semiconductor strip 116, and a dielectric layer 118 are formed in each of the first trenches 106 and the second trenches 120. In this embodiment, no other layers are formed in the first trenches 106 and the second trenches 120. In another embodiment (discussed further below) additional layers are formed in the first trenches 106 and the second trenches 120.

The ferroelectric strips 114 are data storage strips formed of an acceptable ferroelectric material for storing digital values, such as hafnium zirconium oxide (HfZrO); hafnium aluminum oxide (HfAlO), zirconium oxide (ZrO); hafnium oxide (HfO) doped with lanthanum (La), silicon (Si), aluminum (Al), or the like; undoped hafnium oxide (HfO); or the like. The material of the ferroelectric strips 114 may be formed by an acceptable deposition process such as ALD, CVD, physical vapor deposition (PVD), or the like.

The semiconductor strips 116 are formed of an acceptable semiconductor material for providing channel regions of TFTs, such as zinc oxide (ZnO), indium tungsten oxide (InWO), indium gallium zinc oxide (InGaZnO), indium zinc oxide (InZnO), indium tin oxide (ITO), indium gallium zinc tin oxide (IGZTO), polysilicon, amorphous silicon, or the like. The material of the semiconductor strips 116 may be formed by an acceptable deposition process such as ALD, CVD, PVD, or the like.

The dielectric layers 118 are formed of a dielectric material. Acceptable dielectric materials include oxides such as silicon oxide and aluminum oxide; nitrides such as silicon nitride; carbides such as silicon carbide; the like; or combinations thereof such as silicon oxynitride, silicon oxycarbide, silicon carbonitride, or the like. The material of the dielectric layers 118 may be formed by an acceptable deposition process such as ALD, CVD, flowable CVD (FCVD), or the like.

The ferroelectric strips 114, the semiconductor strips 116, and the dielectric layers 118 may be formed by a combination of deposition, etching, and planarization. For example, a ferroelectric layer can be conformally deposited on the multilayer stack 104 and in the first trenches 106 (e.g., on sidewalls of the first conductive features 112A and sidewalls of the first dielectric layers 104A). A semiconductor layer can then be conformally deposited on the ferroelectric layer. The semiconductor layer can then be anisotropically etched to remove horizontal portions of the semiconductor layer, thus exposing the ferroelectric layer. A dielectric layer can then be conformally deposited on the remaining vertical portions of the semiconductor layer and the exposed portions of the ferroelectric layer. A planarization process is then applied to the various layers to remove excess materials over the multilayer stack 104. The planarization process may be a chemical mechanical polish (CMP), an etch-back process, combinations thereof, or the like. The portions of the ferroelectric layer, the semiconductor layer, and the dielectric layer remaining in the first trenches 106 form the ferroelectric strips 114, the semiconductor strips 116, and the dielectric layers 118, respectively. The planarization process exposes the multilayer stack 104 such that top surfaces of the multilayer stack 104, the ferroelectric strips 114, the semiconductor strips 116, and the dielectric layers 118 are coplanar (within process variations) after the planarization process.

Figure 12A:
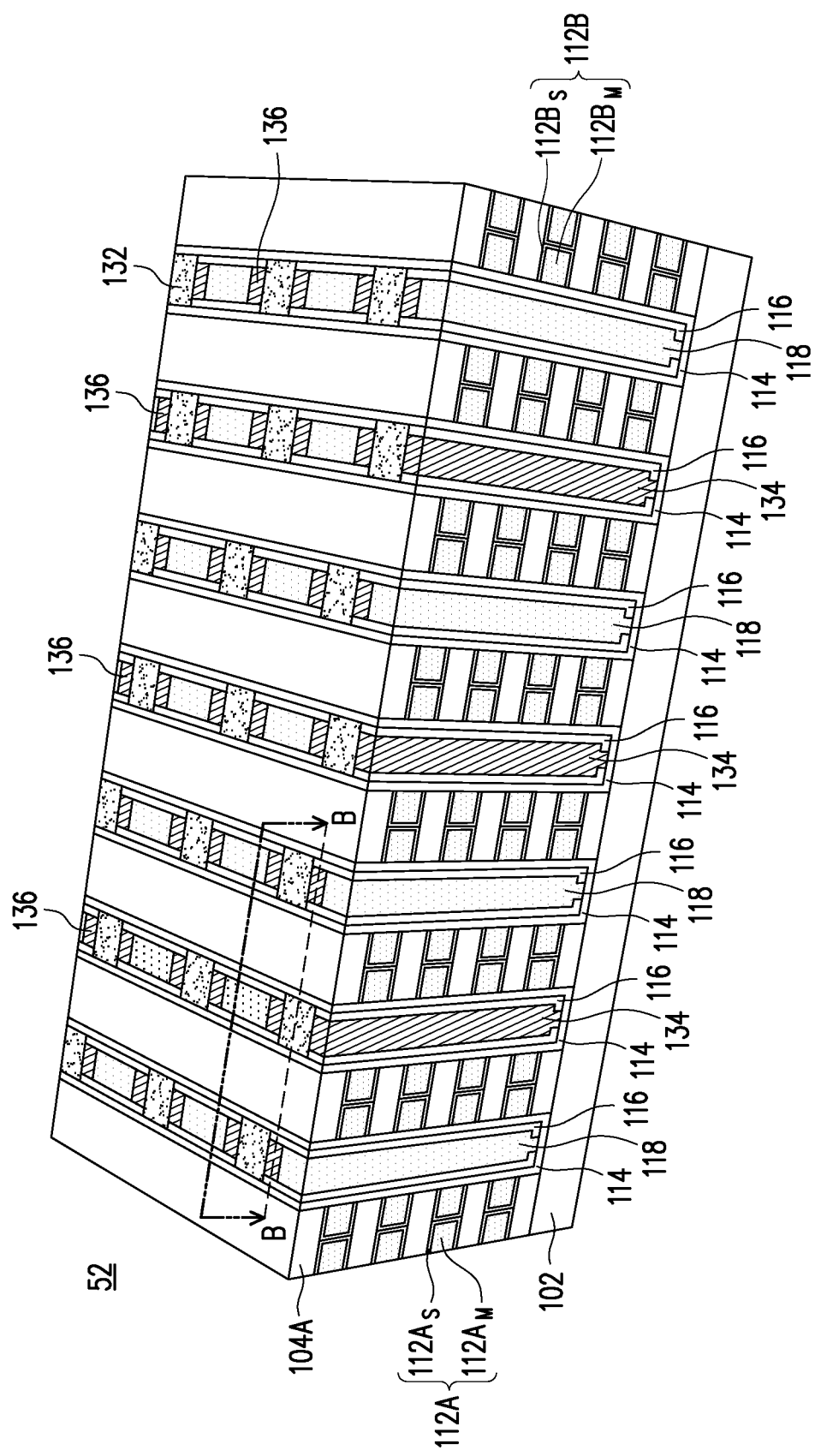
Figure 12B:
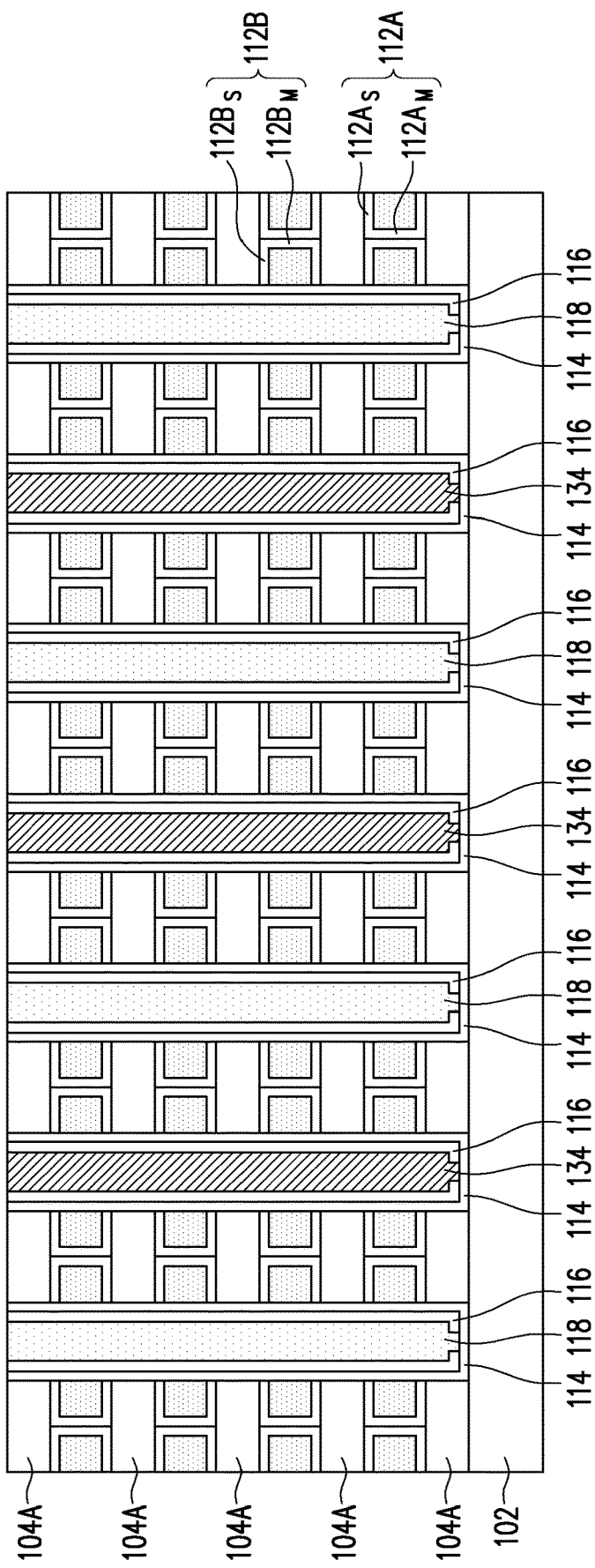

In FIGS. 12A and 12B, dielectric plugs 132 are formed through the dielectric layers 118 and the semiconductor strips 116. The dielectric plugs 132 are isolation columns that will be disposed between adjacent TFTs, and will physically and electrically separate the adjacent TFTs. In the illustrated embodiment, the dielectric plugs 132 do not extend through the ferroelectric strips 114. Different regions of the ferroelectric strips 114 may be independently polarized, and thus the ferroelectric strips 114 can function to store values even when adjacent regions are not physically and electrically separated. In another embodiment, the dielectric plugs 132 are also formed through the ferroelectric strips 114. The dielectric plugs 132 further extend through the first dielectric layers 104A and any remaining portions of the second dielectric layers 104B.

As an example to form the dielectric plugs 132, openings for the dielectric plugs 132 can be formed through the dielectric layers 118 and the semiconductor strips 116. The openings may be formed using acceptable photolithography and etching techniques. One or more dielectric material(s) are then formed in the openings. Acceptable dielectric materials include oxides such as silicon oxide; nitrides such as silicon nitride; carbides such as silicon carbide; the like; or combinations thereof such as silicon oxynitride, silicon oxycarbide, silicon carbonitride, or the like. The dielectric material(s) may be formed by an acceptable deposition process such as ALD, CVD, or the like. In some embodiments, silicon oxide or silicon nitride is deposited in the openings. A planarization process is then applied to the various layers to remove excess dielectric material(s) over the topmost first dielectric layer 104A. The planarization process may be a chemical mechanical polish (CMP), an etch-back process, combinations thereof, or the like. The remaining dielectric material(s) form the dielectric plugs 132 in the openings.

FIGS. 12A and 12B additionally illustrate that bit lines 134 and source lines 136 are formed through the dielectric layers 118. The bit lines 134 and the source lines 136 further extend through the first dielectric layers 104A and any remaining portions of the second dielectric layers 104B. The bit lines 134 and the source lines 136 act as source/drain regions of the TFTs. The bit lines 134 and the source lines 136 are conductive columns that are formed in pairs, with each semiconductor strip 116 contacting a corresponding bit line 134 and a corresponding source line 136. Each TFT comprises a bit line 134, a source line 136, a word line 112, and the regions of the semiconductor strip 116 and the ferroelectric strip 114 intersecting the word line 112. Each dielectric plug 132 is disposed between a bit line 134 of a TFT and a source line 136 of another TFT. In other words, a bit line 134 and a source line 136 are disposed at opposing sides of each of the dielectric plugs 132. Thus, each dielectric plug 132 physically and electrically separates adjacent TFTs.

As an example to form the bit lines 134 and the source lines 136, openings for the bit lines 134 and the source lines 136 can be formed through the dielectric layers 118. The openings may be formed using acceptable photolithography and etching techniques. Specifically, the openings are formed on opposing sides of the dielectric plugs 132. One or more conductive material(s), e.g., a glue layer and a bulk conductive material, are then formed in the openings. Acceptable conductive materials include metals such as tungsten, cobalt, aluminum, nickel, copper, silver, gold, alloys thereof, titanium nitride, tantalum nitride, combinations of these, or the like. The conductive material(s) may be formed by an acceptable deposition process such as ALD or CVD, an acceptable plating process such as electroplating or electroless plating, or the like. In some embodiments, tungsten is deposited in the openings. A planarization process is then applied to the various layers to remove excess conductive material(s) over the topmost first dielectric layer 104A. The planarization process may be a chemical mechanical polish (CMP), an etch-back process, combinations thereof, or the like. The remaining conductive material(s) form the bit lines 134 and the source lines 136 in the openings.

Figure 13A:
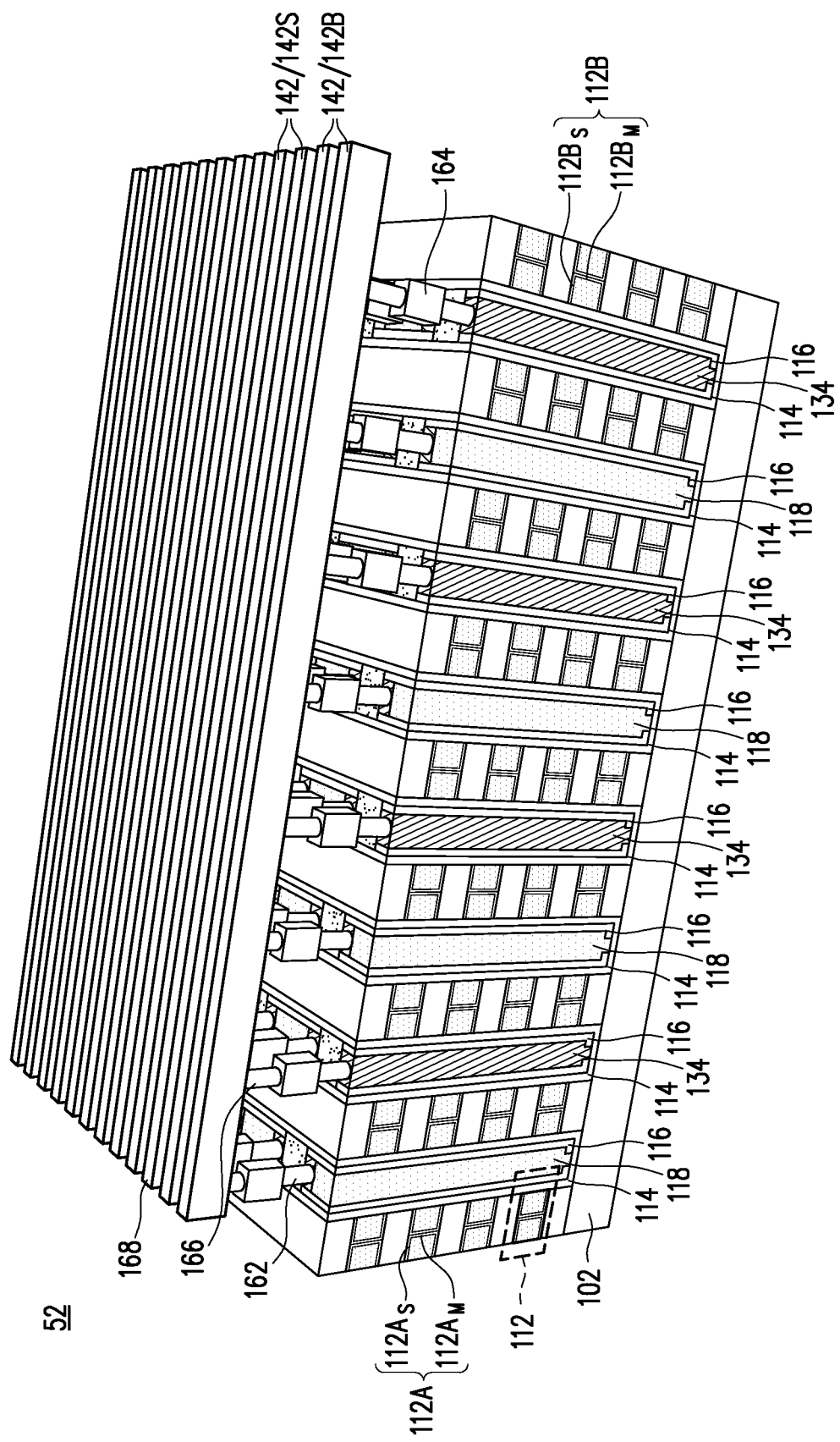
Figure 13B:
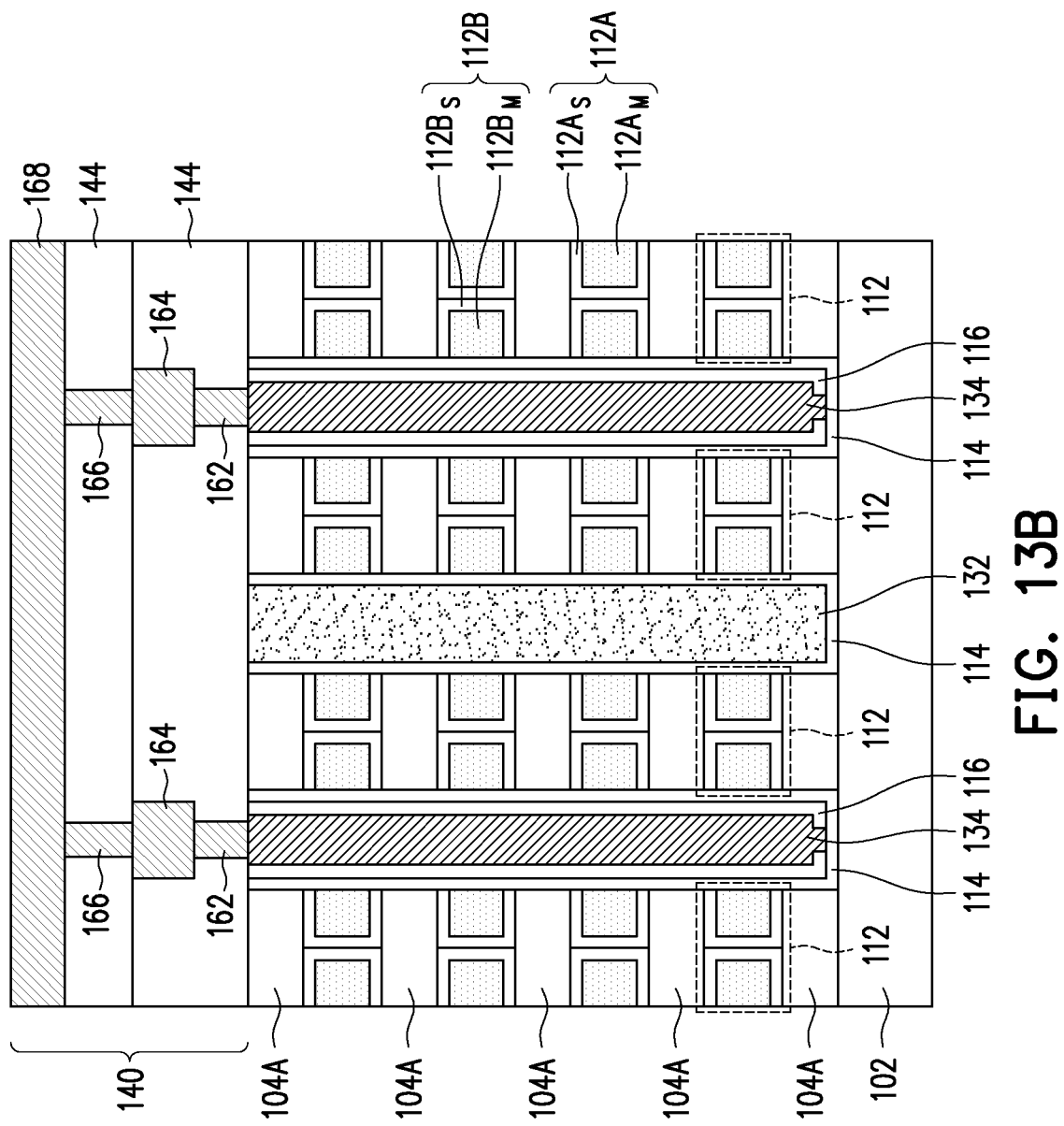
Figure 13C:
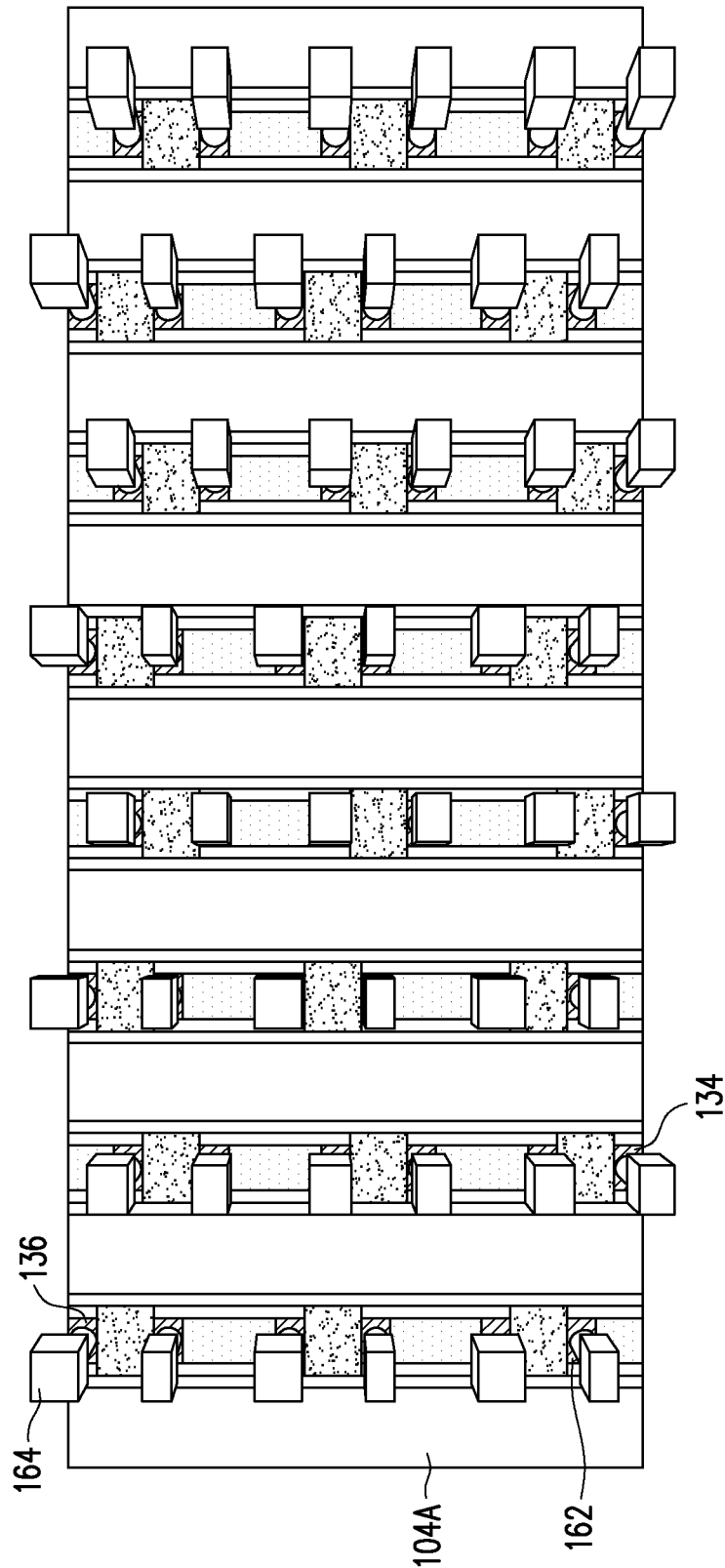
Figure 13D:
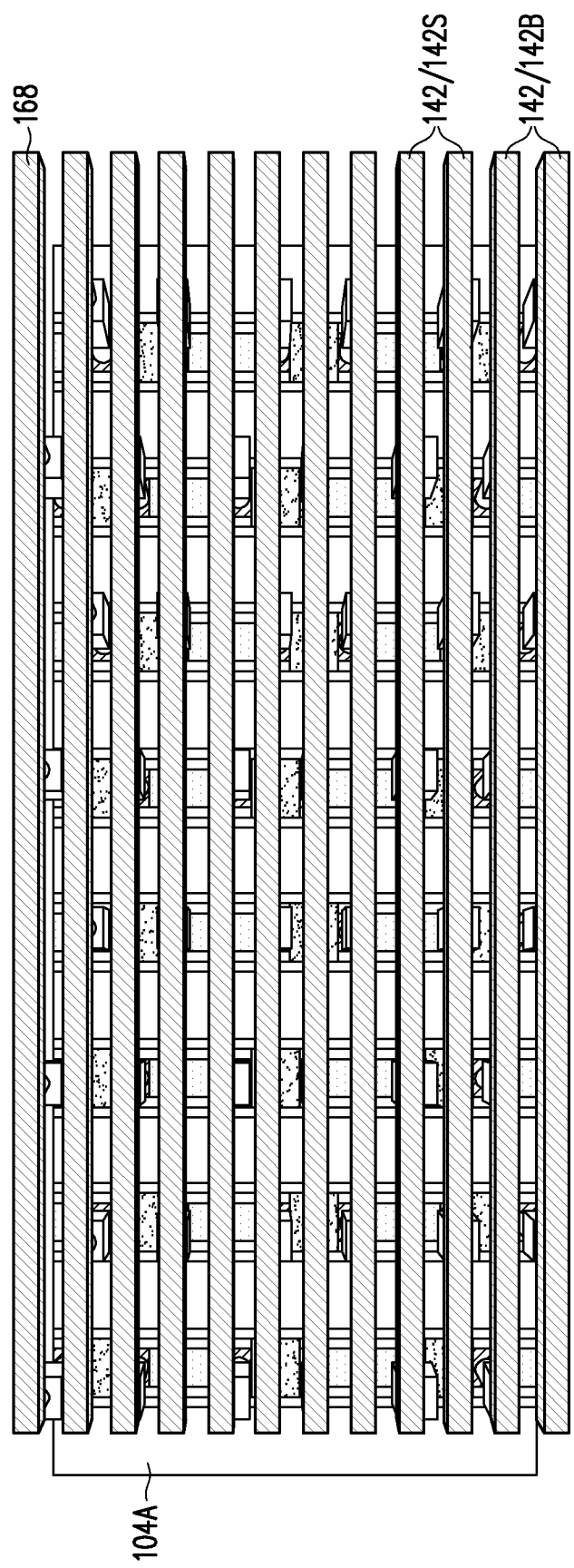

In FIGS. 13A, 13B, 13C and 13D, an interconnect structure 140 is formed over the intermediate structure, with FIG. 13B illustrating a cross-section view of the structure of FIG. 13A, FIG. 13C illustrating a top down view of the structure of FIG. 13A at the level of a first metal line 164, and FIG. 13D illustrating a top down view of the structure of FIG. 13A at the level of a metallization pattern 142. Only some features of the interconnect structure 140 are shown in FIG. 13A, for clarity of illustration. The interconnect structure 140 may include, e.g., metallization patterns 142 in a dielectric material 144. The dielectric material 144 may include one or more dielectric layers, such as one or more layers of a low-k (LK) or an extra low-K (ELK) dielectric material. The metallization patterns 142 may be metal interconnects (e.g., metal lines and vias) formed in the one or more dielectric layers. The interconnect structure 140 may be formed by a damascene process, such as a single damascene process, a dual damascene process, or the like.

In a particular embodiment that is illustrated, the metallization patterns 142 of the interconnect structure 140 comprise a first via 162 (e.g., a via0) which makes contact to the bit lines 134 and the source lines 136, a first metal line 164 (e.g., a first top metal line), a second via 166 (e.g., a via1), and a second metal line 168 (e.g., a second top metal line). Each of these may be formed by depositing a portion of the dielectric material 144 (not separately illustrated in FIG. 13A for clarity), forming patterns within the portion of the dielectric material 144, filling the patterns with one or more conductive materials, and planarizing the conductive materials with the dielectric material 144. However, any suitable number of vias and conductive lines may be utilized, and all such layers of connectivity are fully intended to be included within the scope of the embodiments.

In some embodiments, the metallization patterns 142 include bit line interconnects 142B (which are electrically coupled to the bit lines 134) and source line interconnects 142S (which are electrically coupled to the source lines 136). The adjacent bit lines 134 are connected to different bit line interconnects 142B, which helps avoid shorting of the adjacent bit lines 134 when their common word line 112 is activated. Similarly, the adjacent source lines 136 are connected to different source line interconnects 142S, which helps avoid shorting of the adjacent source lines 136 when their common word line 112 is activated.

As can be seen in FIG. 13C, the first vias 162 within the metallization patterns 142 of the interconnect structure 140 are electrically coupled to the bit lines 134 and the source lines 136. In this embodiment, the bit lines 134 and the source lines 136 are formed in a staggered layout, where adjacent bit lines 134 and adjacent source lines 136 are laterally offset from one another along the first direction $D_1$ (see FIG. 2B). Thus, each word line 112 is laterally disposed between a dielectric plug 132 and one of a bit line 134 or a source line 136. The first vias 162 connected to the bit lines 134 and the first vias 162 connected to the source lines 136 each extend along the second direction $D_2$ (see FIG. 2B), e.g., along the columns of the memory array 52. The first vias 162 connected to the bit lines 134 are connected to alternating ones of the bit lines 134 along the columns of the memory array 52. The first vias 162 connected to the source line interconnects 142S are connected to alternating ones of the source lines 136 along the columns of the memory array 52. Laterally offsetting the bit lines 134 and the source lines 136 obviates the need for lateral interconnects along the columns of the memory array 52, thus allowing the overlying metallization patterns 142 to the bit lines 134 and the source lines 136 to be straight conductive segments. In another embodiment the bit lines 134 and the source lines 136 may not be formed in a staggered layout, and instead lateral interconnection is accomplished in the interconnect structure 140.

In particular, FIG. 13D illustrates the straight conductive segments within the overlying metallization patterns 142 (e.g., the second metal line 168). As can be seen, because the underlying connections have been formed in a staggered formation, the bit line interconnects 142B and the source line interconnects 142S can be placed in a straight line formation without the need for lateral interconnects. Such alignment greatly increases the line density in the metallization layers.

Figure 14A:
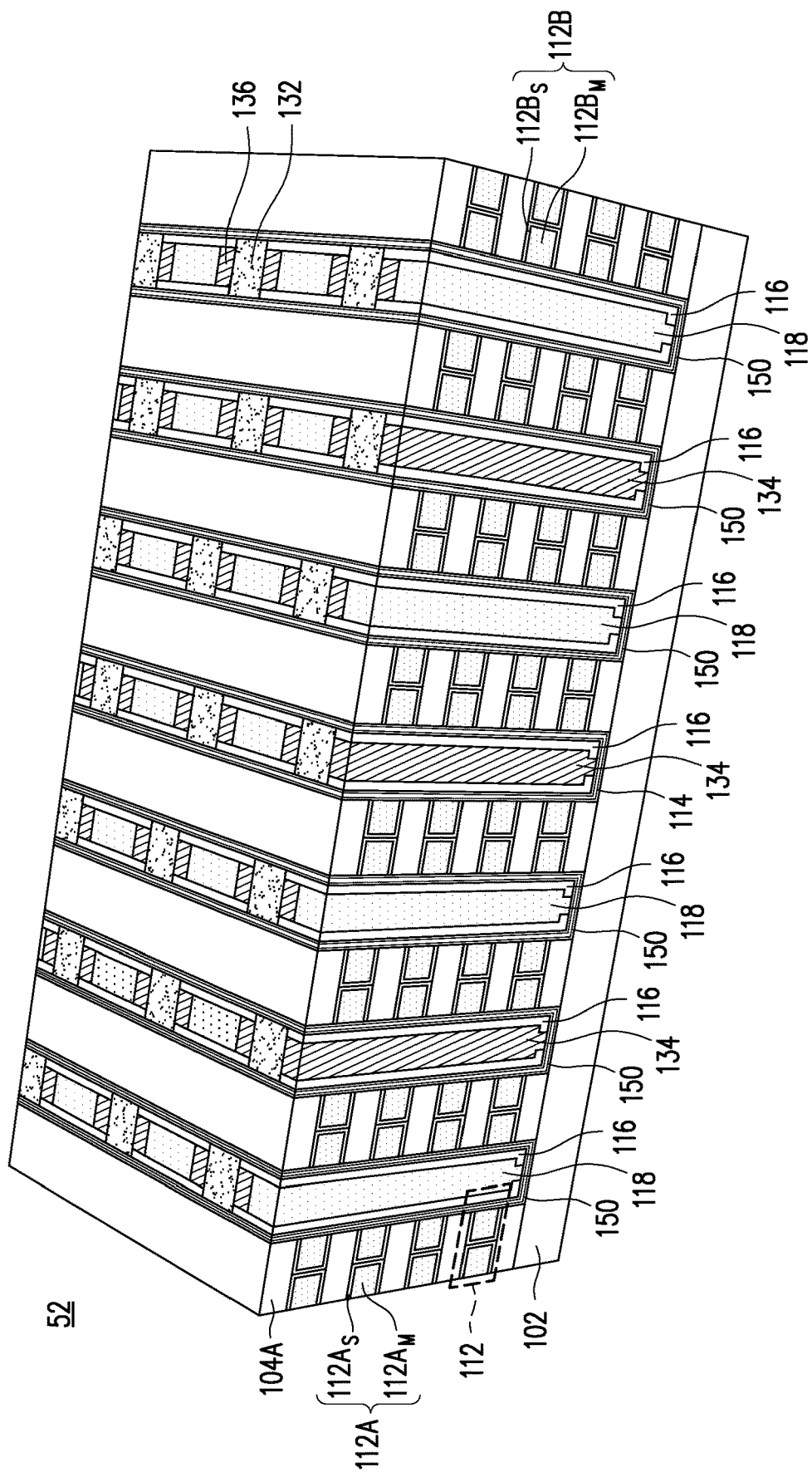
FIGS. 14A and 14B are various views of a memory array, in accordance with some other embodiments.
Figure 14B:
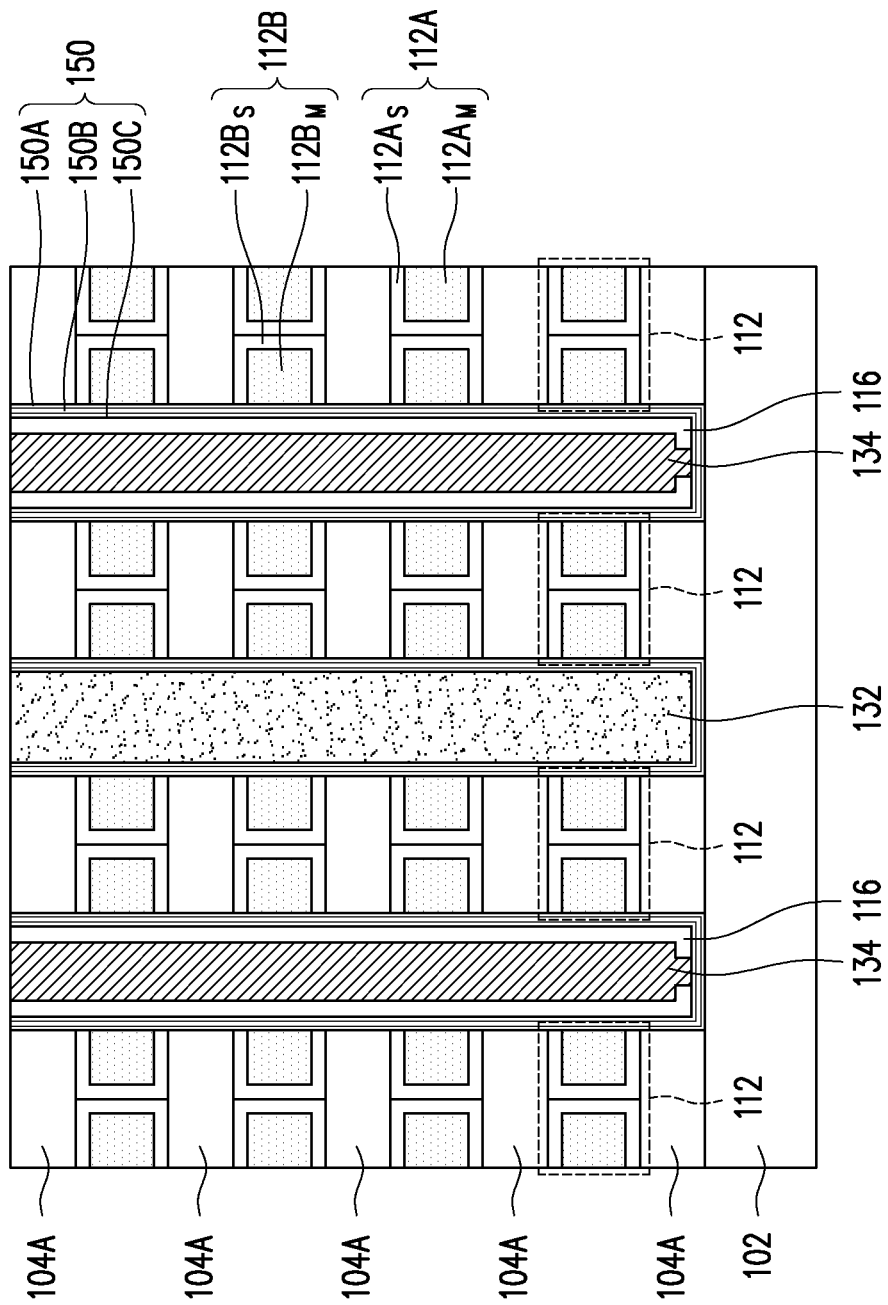

FIGS. 14A and 14B are various views of a memory array 52, in accordance with some other embodiments. A portion of the memory array 52 is illustrated. Some features, such as the staircase arrangement of the word lines (see FIG. 2B), are not shown for clarity of illustration. FIG. 14A is a three-dimensional view of the memory array 52, and FIG. 14B is a cross-sectional view showing a similar cross-section as reference cross-section B-B in FIG. 12A.

In this embodiment, the ferroelectric strips 114 are omitted and are replaced with a plurality of dielectric layers 150 which are data storage strips, permitting the creation of a NOR flash array. Specifically, first dielectric layers 150A are formed on the substrate 102 and in contact with the sidewalls of the word lines 112. Second dielectric layers 150B are formed on the first dielectric layers 150A. Third dielectric layers 150C are formed on the second dielectric layers 150B. The first dielectric layers 150A, the second dielectric layers 150B, and the third dielectric layers 150C are each formed of dielectric materials. Acceptable dielectric materials include oxides such as silicon oxide; nitrides such as silicon nitride; carbides such as silicon carbide; the like; or combinations thereof such as silicon oxynitride, silicon oxycarbide, silicon carbonitride, or the like. In some embodiments, the first dielectric layers 150A and the third dielectric layers 150C are formed of a first dielectric material (e.g., an oxide such as silicon oxide) and the second dielectric layers 150B are formed of a different second dielectric material (e.g., a nitride such as silicon nitride). The dielectric material(s) may be formed by an acceptable deposition process such as ALD, CVD, or the like. For example, the first dielectric layers 150A, the second dielectric layers 150B, and the third dielectric layers 150C may be formed by a combination of deposition, etching, and planarization, in a similar manner as that discussed above with respect to the ferroelectric strips 114.

Figure 15A:
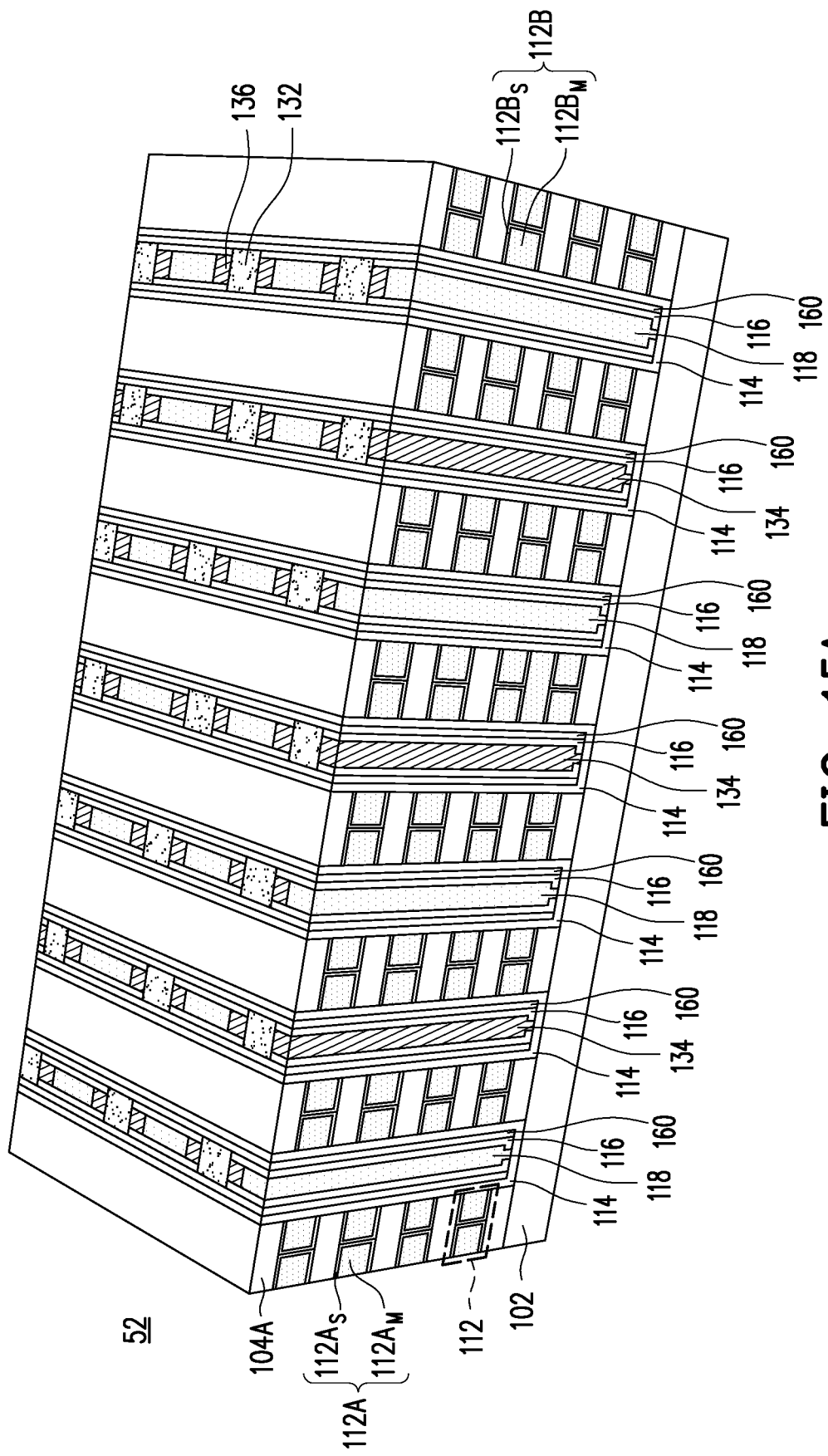
FIGS. 15A and 15B are various views of a memory array, in accordance with some other embodiments.
Figure 15B:
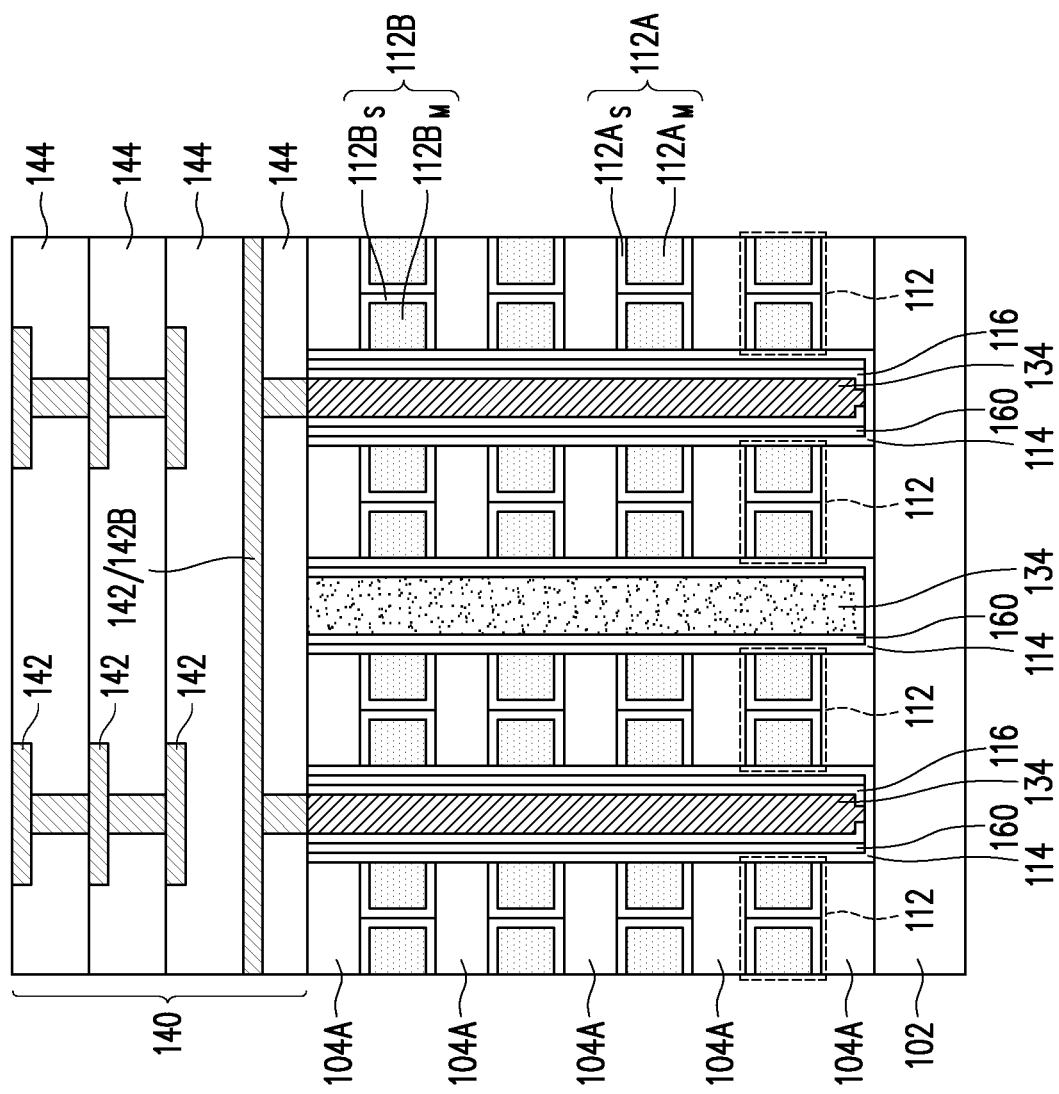

FIGS. 15A and 15B are various views of a memory array 52, in accordance with some other embodiments. A portion of the memory array 52 is illustrated. Some features, such as the staircase arrangement of the word lines (see FIG. 2B), are not shown for clarity of illustration. FIG. 15A is a three-dimensional view of the memory array 52, and FIG. 15B is a cross-sectional view showing a similar cross-section as reference cross-section B-B in FIG. 12A.

In this embodiment, conductive strips 160 are formed between the ferroelectric strips 114 and the semiconductor strips 116. Formation of the conductive strips 160 helps avoid or reduce formation of an interlayer oxide on the ferroelectric strips 114 during formation of the semiconductor strips 116. Avoiding or reducing formation of the interlayer oxide can increase the life span of the memory array 52.

The conductive strips 160 may be formed of a metal such as ruthenium, tungsten, titanium nitride, tantalum nitride, molybdenum, or the like. The conductive material(s) of the conductive strips 160 may be formed by an acceptable deposition process such as ALD or CVD, an acceptable plating process such as electroplating or electroless plating, or the like. A thickness of the conductive strips 160 can be in the range of about 1 nm to about 20 nm. The conductive strips 160 can be formed in a similar manner as the semiconductor strips 116, and can be formed during the formation of the semiconductor strips 116. The dielectric plugs 132 may (or may not) be formed through the conductive strips 160.

Figure 16A:
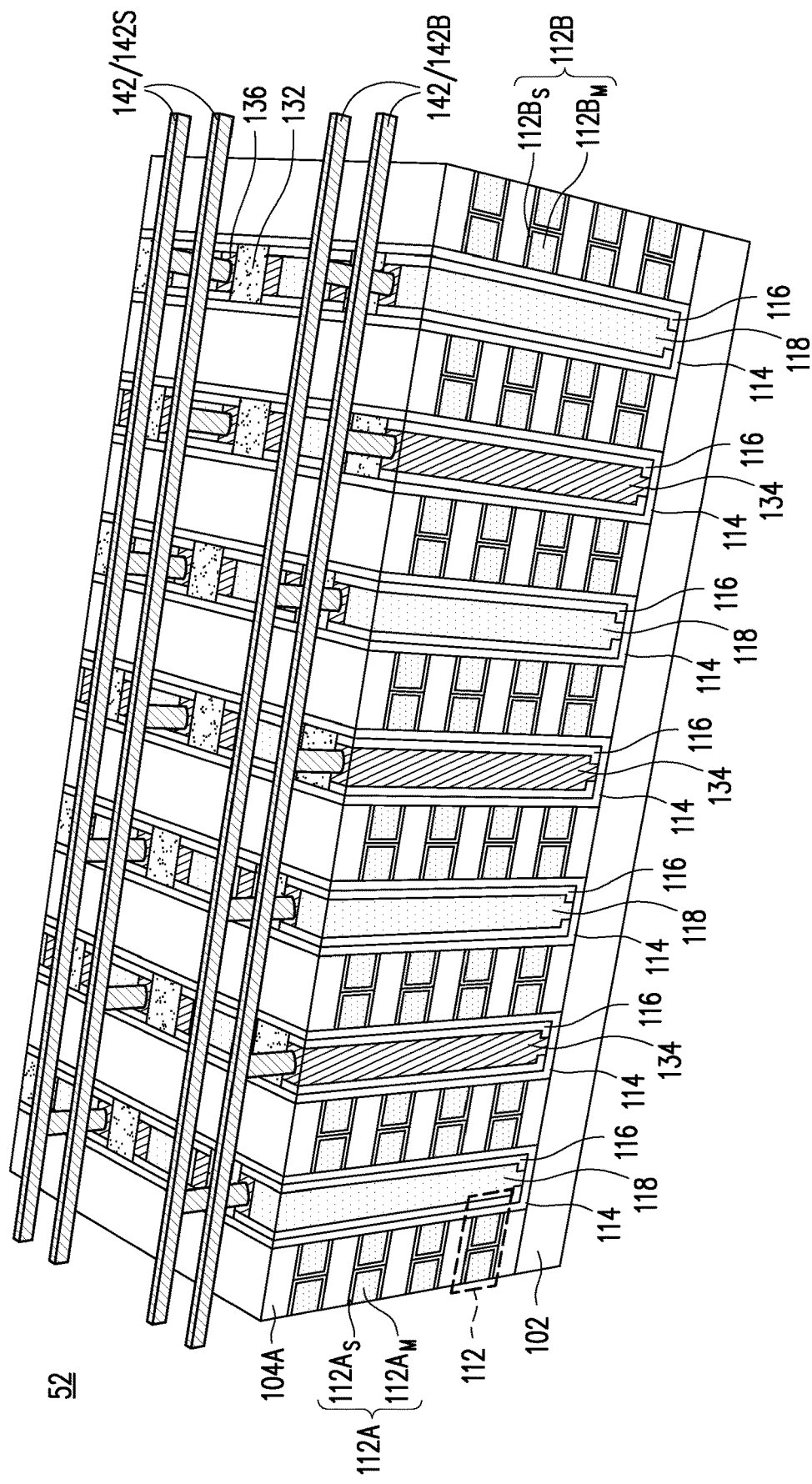
FIGS. 16A and 16B are various views of a memory array, in accordance with some other embodiments.
Figure 16B:
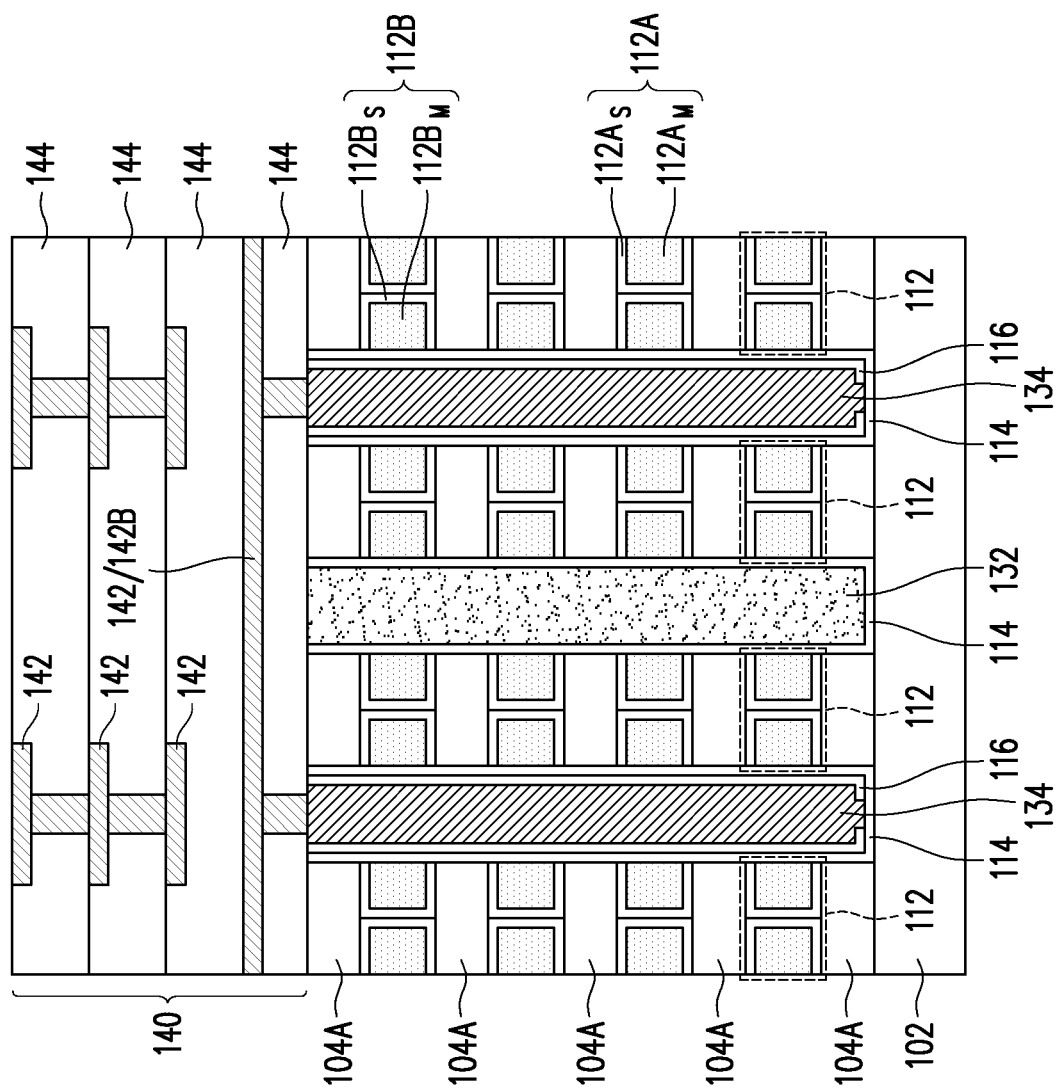

FIGS. 16A and 16B are various views of a memory array 52, in accordance with some other embodiments. A portion of the memory array 52 is illustrated. Some features, such as the staircase arrangement of the word lines (see FIG. 2B), are not shown for clarity of illustration. FIG. 16A is a three-dimensional view of the memory array 52, and FIG. 16B is a cross-sectional view showing a similar cross-section as reference cross-section B-B in FIG. 12A.

In this embodiment, the seed layer 112A$_S$ and the seed layer 112B$_S$ are formed of different materials in order to help lower the overall resistivity. For example, the seed layer 112A$_S$ can be formed of a first glue material (e.g., titanium nitride) and the seed layer 112B$_S$ can be formed of a second glue material (e.g., tantalum nitride) that has a different resistivity. As such, the seed layer 112A$_S$ and the seed layer 112B$_s$ may not merge during formation such that they are separate and distinct from each another.

Figure 17A:
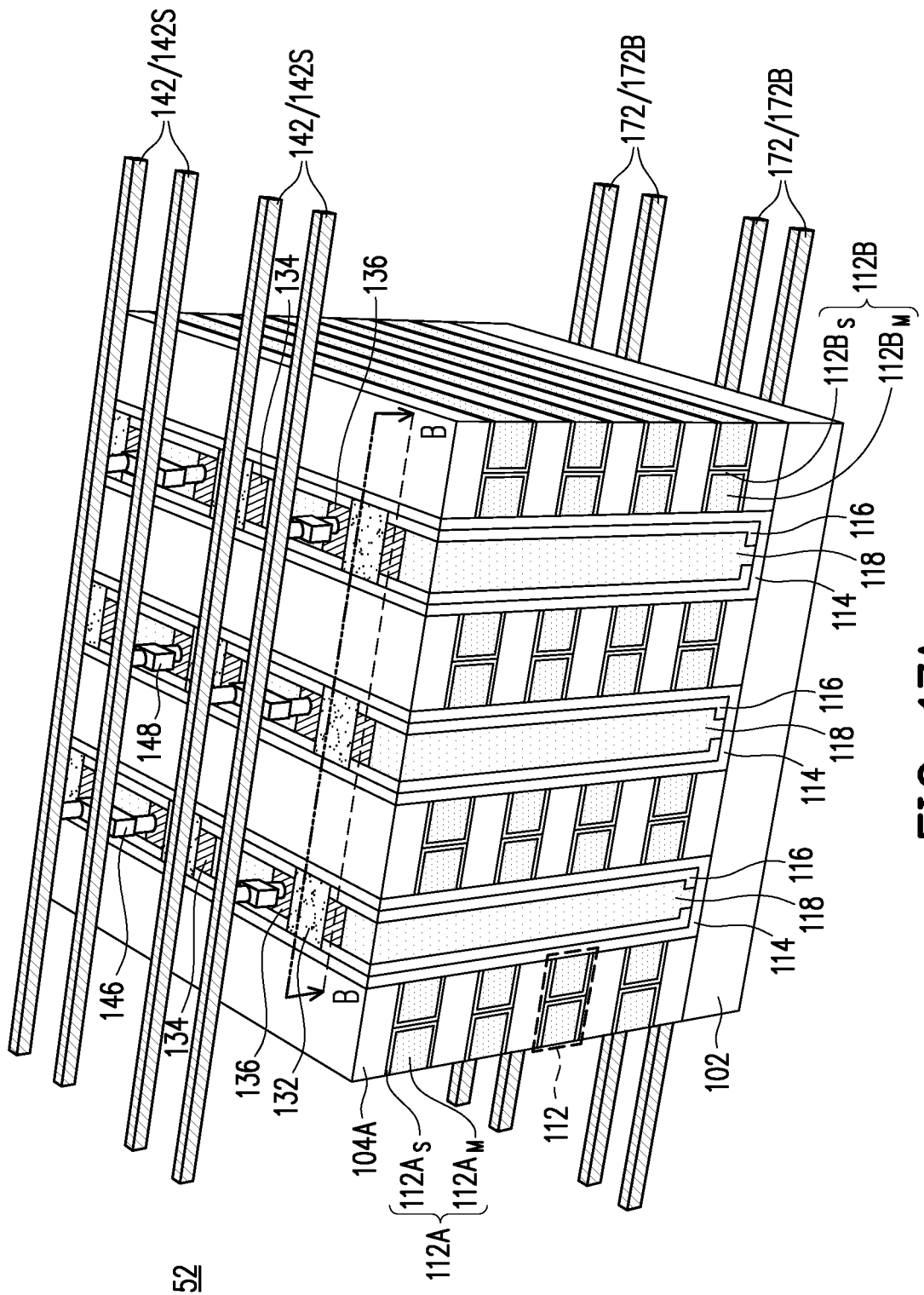
FIGS. 17A and 17B are various views of a memory array, in accordance with some other embodiments.
Figure 17B:
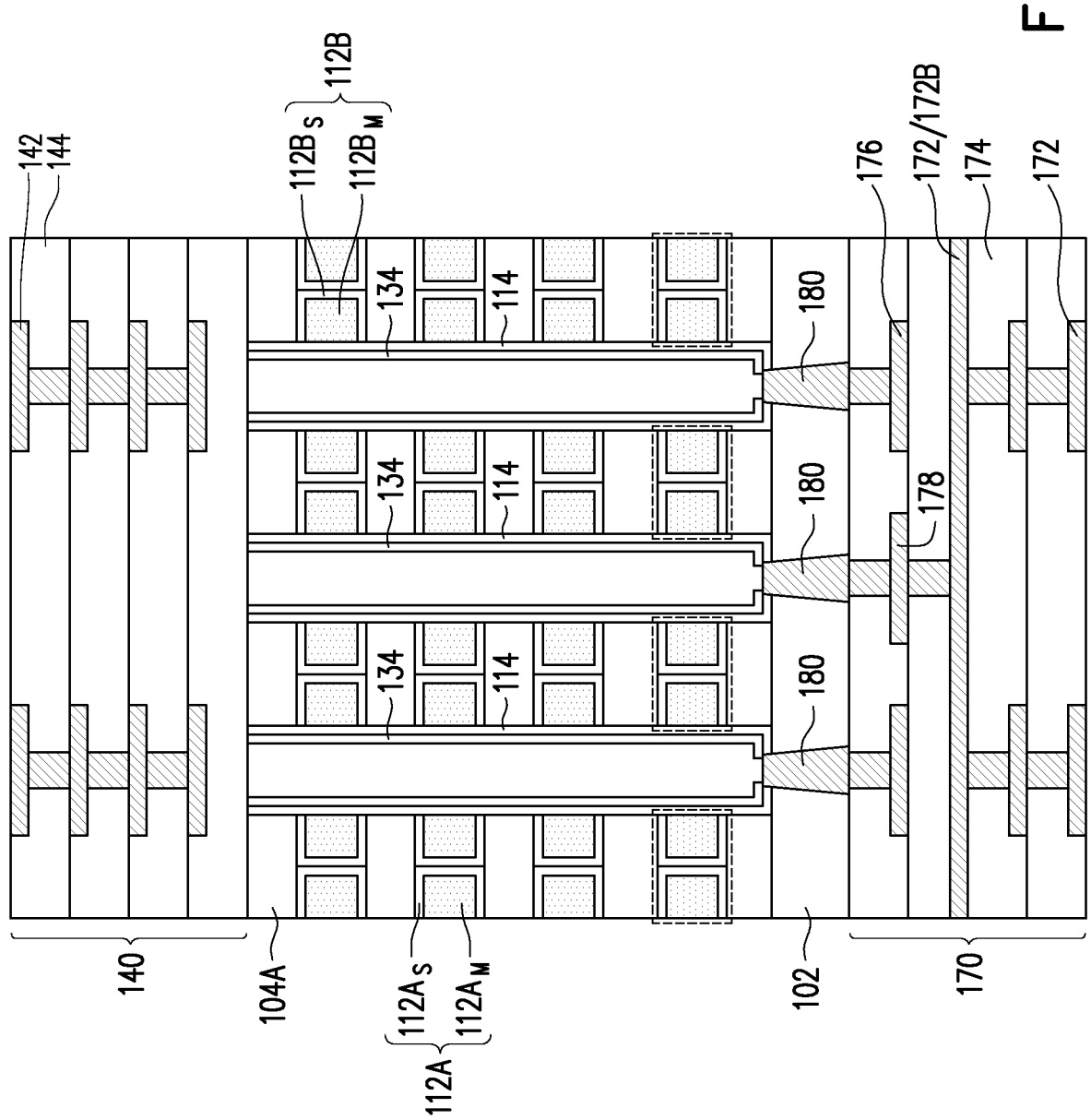

FIGS. 17A and 17B are various views of a memory array 52, in accordance with some other embodiments. A portion of the memory array 52 is illustrated. Some features, such as the staircase arrangement of the word lines (see FIG. 2B), are not shown for clarity of illustration. FIG. 17A is a three-dimensional view of the memory array 52, and FIG. 17B is a cross-sectional view shown along reference cross-section B-B in FIG. 17A.

In this embodiment, the metallization patterns 142 of the interconnect structure 140 only include source line interconnects 142S. Another interconnect structure 170 is formed at an opposite side of the substrate 102 from the interconnect structure 140. The interconnect structure 170 may be formed in a similar manner as the interconnect structure 140. The interconnect structure 170 may include, e.g., metallization patterns 172 in a dielectric material 174. Conductive vias 180 can be formed through the substrate 102 and the ferroelectric strips 114 to electrically couple the metallization patterns 172 to the bit lines 134 and/or the source lines 136. For example, the metallization patterns 172 include bit line interconnects 172B (which are electrically coupled to the source lines 136 by the conductive vias 180).

Further, in this embodiment, the bit lines 134 and the source lines 136 are not formed in a staggered layout, and thus adjacent bit lines 134 and adjacent source lines 136 are laterally aligned with one another along the first direction D$_1$ (see FIG. 2B). Thus, each word line 112 is laterally disposed between a pair of bit lines 134 or a pair of source lines 136. Because the bit lines 134 and the source lines 136 are not formed in a staggered layout, lateral interconnection to a subset of the source line interconnects 142S is accomplished in the interconnect structure 140, and lateral interconnection to a subset of the bit line interconnects 172B is accomplished in the interconnect structure 170. For example, the source line interconnects 142S are straight conductive segments that are formed at an intermediate level of the interconnect structure 140. Lateral interconnects 146 between a first subset of the source line interconnects 142S and the source lines 136 are formed at a lower level of the interconnect structure 140 than the source line interconnects 142S. Straight interconnects 148 between a second subset of the source line interconnects 142S and the source lines 136 are formed at a lower level of the interconnect structure 140 than the source line interconnects 142S. Similarly, the bit line interconnects 172B are straight conductive segments that are formed at an intermediate level of the interconnect structure 170. Lateral interconnects 176 between a first subset of the bit line interconnects 172B and the bit lines 134 are formed at a lower level of the interconnect structure 170 than the bit line interconnects 172B. Straight interconnects 178 between a second subset of the bit line interconnects 172B and the bit lines 134 are formed at a lower level of the interconnect structure 140 than the bit line interconnects 172B.

It should be appreciated that the layouts of the interconnect structures 140, 170 may be flipped in other embodiments. For example, the metallization patterns 142 of the interconnect structure 140 can include bit line interconnects, and the metallization patterns 172 of the interconnect structure 170 can include source line interconnects.

Figure 18A:
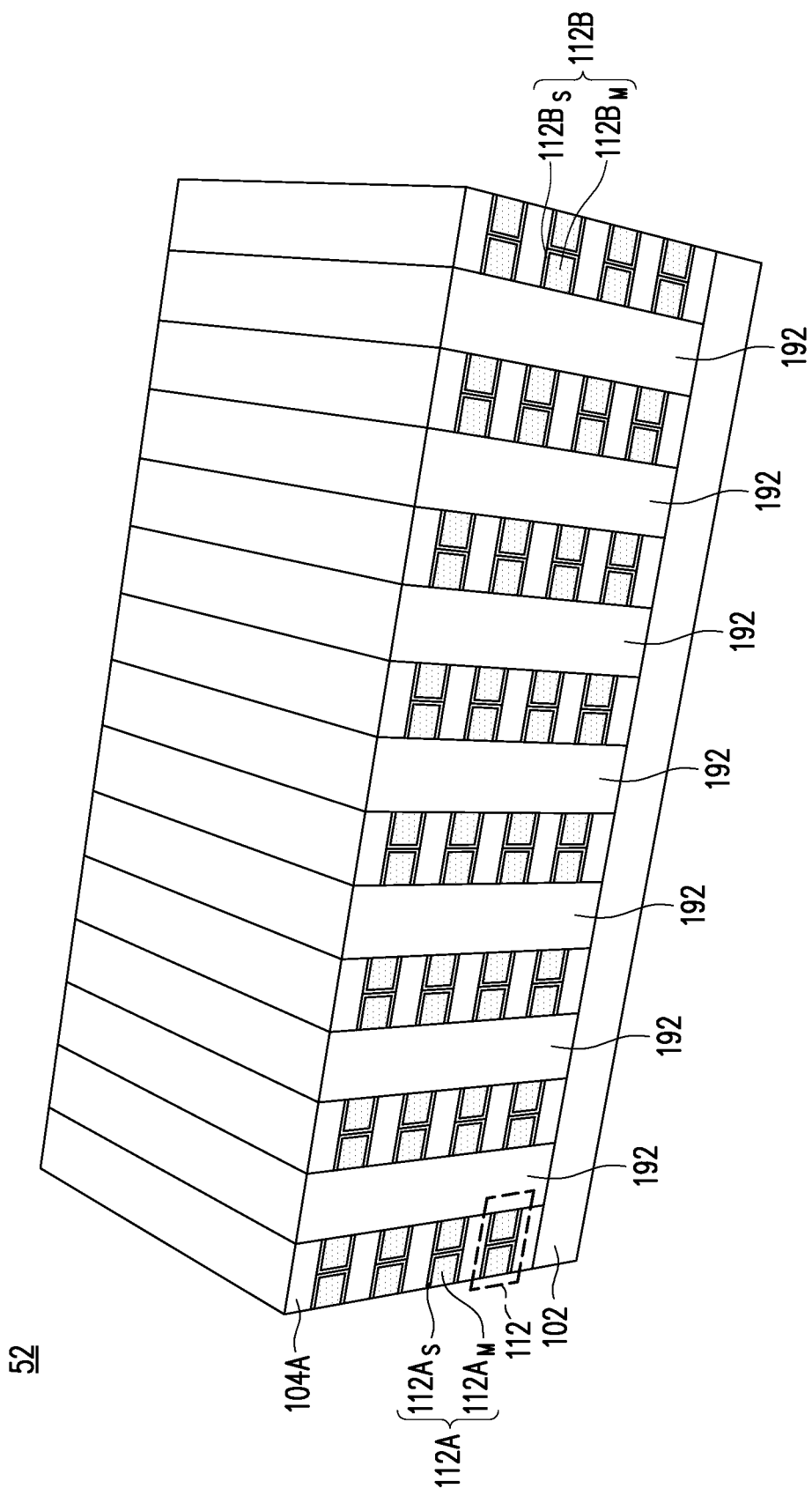
FIGS. 18A and 18B are various views of a memory array, in accordance with some other embodiments.
Figure 18B:
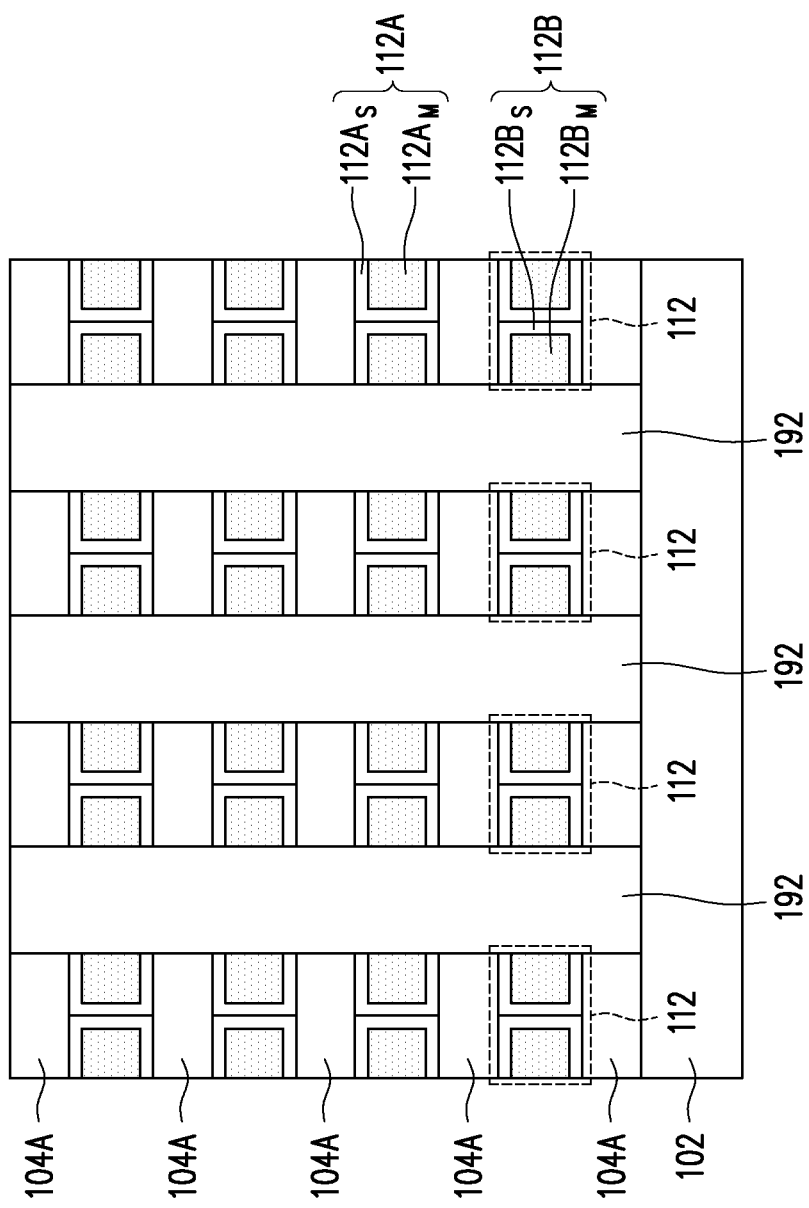
Figure 19A:
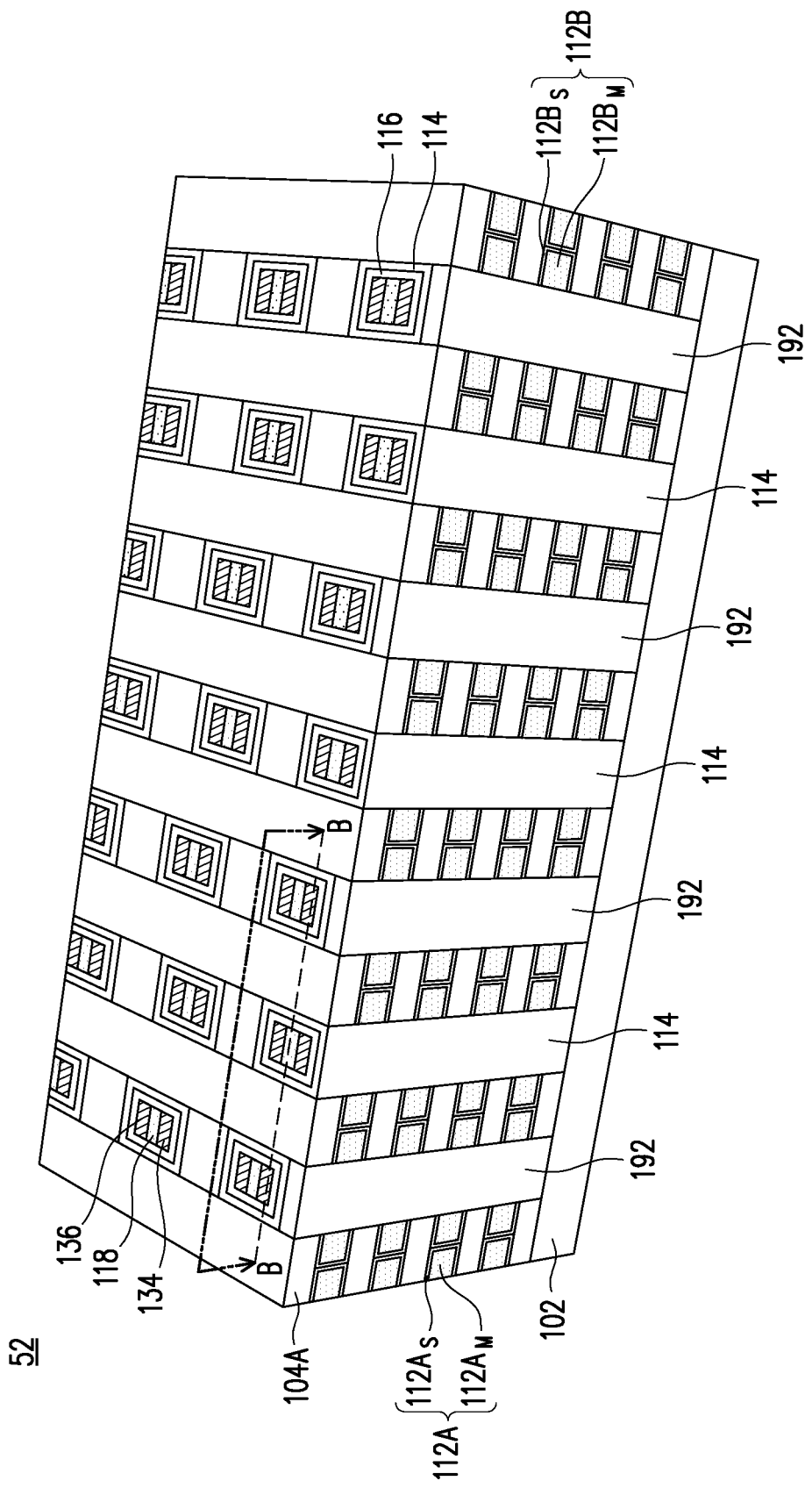
FIGS. 19A through 20B are various views of intermediate stages in the manufacturing of a memory array, in accordance with some other embodiments.
Figure 19B:
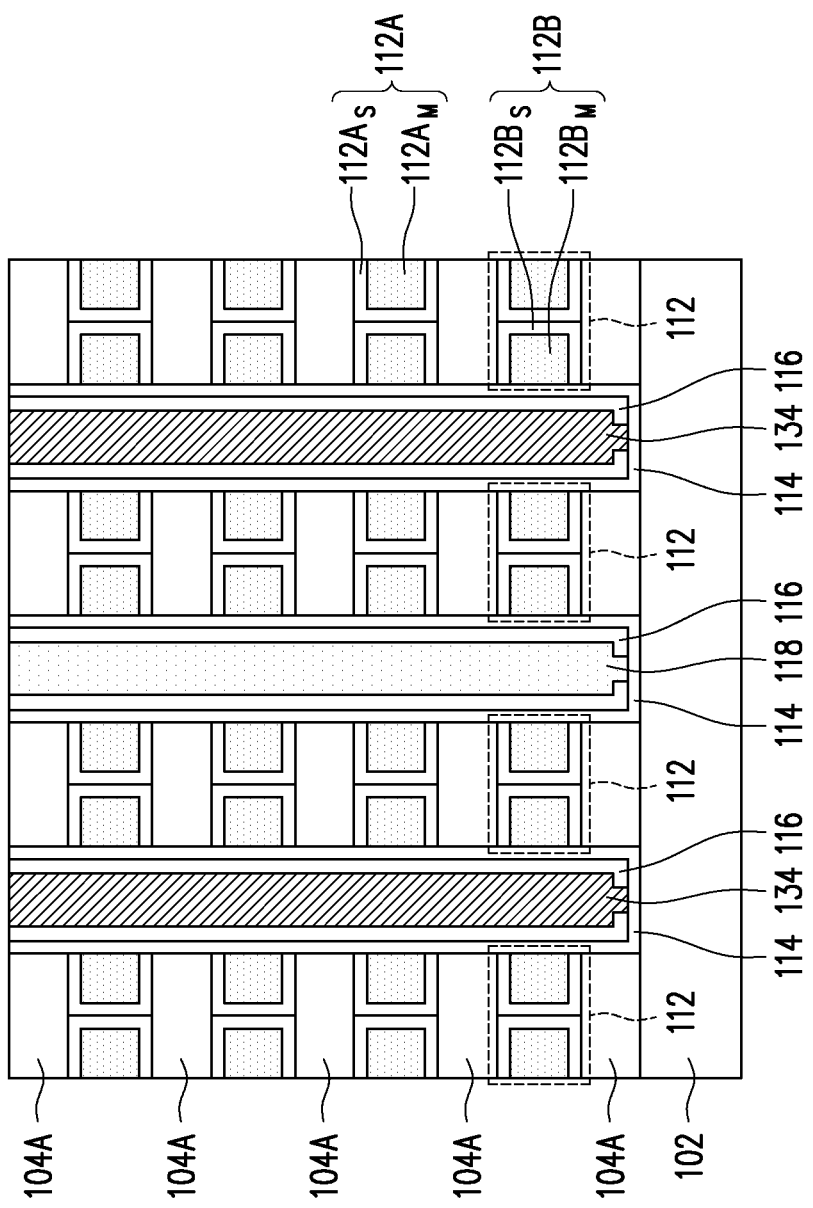
Figure 20A:
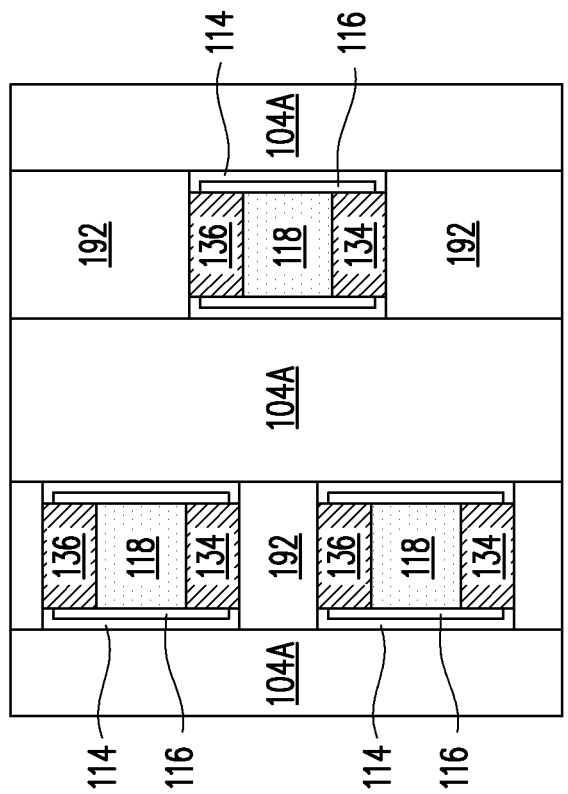
Figure 20B:
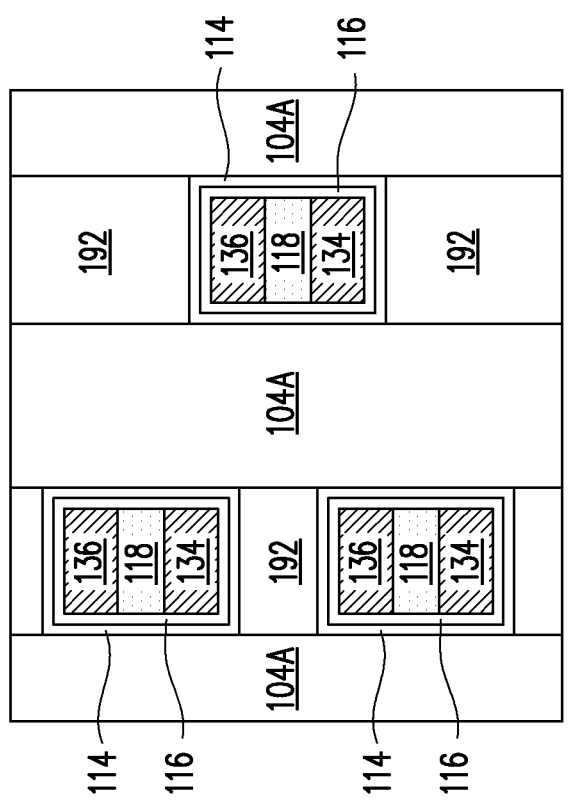

FIGS. 18A through 20B are various views of intermediate stages in the manufacturing of a memory array 52, in accordance with some other embodiments. A portion of the memory array 52 is illustrated. Some features, such as the staircase arrangement of the word lines (see FIG. 2B), are not shown for clarity of illustration. FIGS. 18A and 19A are three-dimensional views of the memory array 52. FIGS. 18B and 19B are a cross-sectional views shown along reference cross-section B-B in FIG. 19A. FIGS. 20A and 20B are top-down views of a portion of the memory array 52.

In FIGS. 18A and 18B, a structure similar to that described with respect to FIGS. 13A and 13B is obtained, however, the ferroelectric strips 114, the semiconductor strips 116, and the dielectric layers 118 are not formed at this step of processing. Instead, the first trenches 106 (see FIGS. 4A and 4B) and the second trenches 120 (see FIGS. 8A and 8B) are each filled with a dielectric layer 192. The dielectric layers 192 are formed of a dielectric material. Acceptable dielectric materials include oxides such as silicon oxide; nitrides such as silicon nitride; carbides such as silicon carbide; the like; or combinations thereof such as silicon oxynitride, silicon oxycarbide, silicon carbonitride, or the like. The dielectric material(s) may be formed by an acceptable deposition process such as ALD, CVD, or the like. In some embodiments, silicon oxide is deposited in the first trenches 106 and the second trenches 120. Planarization processes may be applied to the various layers to remove excess dielectric materials over the topmost first dielectric layer 104A. The planarization process may be a chemical mechanical polish (CMP), an etch-back process, combinations thereof, or the like. For example, a first planarization process can be performed after the first trenches 106 are filled to form the dielectric layers 192, and a second planarization process can be performed after the second trenches 120 are filled to form the dielectric layers 192.

In FIGS. 19A and 19B, TFT film stacks are formed extending through the dielectric layers 192. The TFT film stacks each include a ferroelectric strip 114, a semiconductor strip 116, and a dielectric layer 118. Bit lines 134 and source lines 136 are then formed through at least the dielectric layers 118.

The ferroelectric strips 114, the semiconductor strips 116, and the dielectric layers 118 may be formed by a combination of deposition, etching, and planarization. For example, openings can be formed through the dielectric layers 192. The openings may be formed using acceptable photolithography and etching techniques. A ferroelectric layer can be conformally deposited in the openings through the dielectric layers 192. A semiconductor layer can then be conformally deposited on the ferroelectric layer. The semiconductor layer can then be anisotropically etched to remove horizontal portions of the semiconductor layer, thus exposing the ferroelectric layer. A dielectric layer can then be conformally deposited on the remaining vertical portions of the semiconductor layer and the exposed portions of the ferroelectric layer. A planarization process is then applied to the various layers to remove excess materials over the topmost first dielectric layer 104A. The planarization process may be a chemical mechanical polish (CMP), an etch-back process, combinations thereof, or the like. The portions of the ferroelectric layer, the semiconductor layer, and the dielectric layer remaining in the openings through the dielectric layers 192 form the ferroelectric strips 114, the semiconductor strips 116, and the dielectric layers 118, respectively. The planarization process exposes the topmost first dielectric layer 104A such that top surfaces of the topmost first dielectric layer 104A, the ferroelectric strips 114, the semiconductor strips 116, and the dielectric layers 118 are coplanar (within process variations) after the planarization process.

As an example to form the bit lines 134 and the source lines 136, openings for the bit lines 134 and the source lines 136 can be formed through the dielectric layers 118, and optionally also the ferroelectric strips 114 and the semiconductor strips 116. The openings may be formed using acceptable photolithography and etching techniques. Specifically, the openings are formed so that they oppose the sides of the remaining portions of the dielectric layers 118. In some embodiments, the openings only extend through the dielectric layers 118, so that the bit lines 134 and the source lines 136 only extend through the dielectric layers 118 (as shown by FIG. 19A). In some embodiments, the openings also extend through the ferroelectric strips 114 and the semiconductor strips 116, so that the bit lines 134 and the source lines 136 also extend through the ferroelectric strips 114 and the semiconductor strips 116. One or more conductive material(s) are then formed in the openings. Acceptable conductive materials include metals such as tungsten, cobalt, aluminum, nickel, copper, silver, gold, alloys thereof, or the like. The conductive material(s) may be formed by an acceptable deposition process such as ALD or CVD, an acceptable plating process such as electroplating or electroless plating, or the like. In some embodiments, tungsten is deposited in the openings. A planarization process is then applied to the various layers to remove excess conductive material(s) over the topmost first dielectric layer 104A. The planarization process may be a chemical mechanical polish (CMP), an etch-back process, combinations thereof, or the like. The remaining conductive material(s) form the bit lines 134 and the source lines 136 in the openings. Interconnects may then be formed over (or under) the bit lines 134 and the source lines 136, using similar techniques as those discussed above, so that the bit lines 134 and the source lines 136 may be coupled to bit line interconnects and source lines interconnects, respectively.

By utilizing the above described processes in order to form the word lines 112, the word lines 112 can be formed with a reduced possibility of wiggling or even collapse. In particular, by using two separate etching processes and then filling the trenches between the etching processes, the widths of the remaining structures at any point in the process remain wide enough to provide sufficient structural support to help prevent wiggling and collapse. Additionally, this reduction can be achieved with a low cost and no extra masks.

In accordance with an embodiment, a method of manufacturing a semiconductor device includes: etching a first trench in a multilayer stack, the multilayer stack comprising alternating dielectric layers and sacrificial layers; depositing a first conductive material to fill the first trench; after the depositing the first conductive material, etching a second trench in the multilayer stack; depositing a second conductive material to fill the second trench; and etching the first conductive material and the second conductive material. In an embodiment the depositing the first conductive material deposits a first seed layer and a first bulk conductive material. In an embodiment the depositing the second conductive material deposits a second seed layer in physical contact with the first seed layer. In an embodiment after the etching the first conductive material and the second conductive material, the first seed layer and the second seed layer have a shape between two of the dielectric layers, the shape being an "H" shape. In an embodiment the method further includes planarizing the first conductive material prior to the etching the second trench, wherein after the planarizing the first conductive material the first conductive material completely spans a top portion of the first trench. In an embodiment after the etching the first conductive material and the second conductive material, the first conductive material has a larger width than the second conductive material. In an embodiment the method further includes: after the etching the first conductive material and the second conductive material, depositing a ferroelectric material into the first trench and the second trench; depositing a channel material into the first trench; and depositing a dielectric material into the first trench after the depositing the channel material.

In accordance with another embodiment, a method of manufacturing a semiconductor device includes: forming an alternating stack of first dielectric materials and sacrificial materials; forming a first portion of a first word line within the alternating stack of first dielectric materials and sacrificial materials, the forming the first portion of the first word line including: etching a first trench in the alternating stack of first dielectric materials and sacrificial materials; forming first recesses by recessing portions of the sacrificial material exposed within the first trench; and depositing a first conductive material into the first recesses to fill the first trench; and forming a second portion of the first word line within the alternating stack of first dielectric materials and sacrificial materials after the forming the first portion of the first word line, the forming the second portion of the first word line includes: etching a second trench in the alternating stack of first dielectric materials and sacrificial materials; forming second recesses by removing a remainder of the sacrificial material; and depositing a second conductive material into the second recesses to fill the second trench. In an embodiment, the method further includes etching the first conductive material and the second conductive material. In an embodiment, the method further includes: depositing a ferroelectric material within the first trench; and depositing a channel material adjacent to the ferroelectric material within the first trench. In an embodiment, the method further includes: etching the channel material; and depositing a dielectric material within the first trench to isolate a first portion of the channel material and a second portion of the channel material. In an embodiment the depositing the first conductive material comprises depositing a first seed layer. In an embodiment the depositing the second conductive material comprises depositing a second seed layer in physical contact with the first seed layer, wherein a combined thickness of the first seed layer and the second seed layer is greater than a thickness of the first seed layer adjacent to a portion of the first dielectric materials. In an embodiment the first recesses have a smaller width than the second recesses.

In accordance with yet another embodiments, a semiconductor device includes: a ferroelectric material extending away from a substrate; a channel material located on a first side of the ferroelectric material; a first dielectric material extending away from a second side of the ferroelectric material opposite the first side; a second dielectric material extending away from the second side of the ferroelectric material; a first conductive material extending away from the second side of the ferroelectric material between the first dielectric material and the second dielectric material, the first conductive material comprising a first bulk material and a first seed layer; and a second conductive material extending away from the first conductive material between the first dielectric material and the second dielectric material, the second conductive material comprising a second bulk material and a second seed layer, the second seed layer being in physical contact with the first seed layer, the second conductive material having a larger width than the first conductive material. In an embodiment the first seed layer and the second seed layer have an "H" shape. In an embodiment the semiconductor device further includes a second ferroelectric material in physical contact with the second conductive material. In an embodiment the first conductive material and the second conductive material collectively have a width of about 80 nm. In an embodiment the first conductive material and the second conductive material are part of a word line of a memory cell. In an embodiment the memory cell is part of a three dimensional memory array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a dielectric material surrounded by a semiconductor material;
a ferroelectric material on an opposite side of the semiconductor material from the dielectric material;
a first conductive element on an opposite side of the ferroelectric material;
a first seed layer on an opposite side of the first conductive element from the ferroelectric material;
a second seed layer in physical contact with the first seed layer; and
a second conductive element on an opposite side of the second seed layer from the first seed layer.

2. The semiconductor device of claim 1, wherein the first seed layer comprises a first material and the second seed layer comprises a second material different from the first material.

3. The semiconductor device of claim 1, wherein the first seed layer comprises a first material and the second seed layer comprises the first material.

4. The semiconductor device of claim 1, wherein a first combination of the first conductive element and the first seed layer has a first width, wherein a second combination of the second conductive element, and wherein the second seed layer has a second width, and the first width is different from the second width.

5. The semiconductor device of claim 1, wherein a first combination of the first conductive element and the first seed layer has a first width and wherein a second combination of the second conductive element and the second seed layer has the first width.

6. The semiconductor device of claim 1, wherein the first seed layer extends along three sides of the first conductive element.

7. The semiconductor device of claim 1, wherein the first conductive element, the first seed layer, the second seed layer, and the second conductive element form a word line.

8. A semiconductor device comprising:
a first word line comprising:
a first seed layer, the first seed layer having a first "U" shape;
a second seed layer in physical contact with the first seed layer, the second seed layer having a second "U" shape;
a first conductive feature in physical contact with the first seed layer;
a second conductive feature in physical contact with the second seed layer;
a ferroelectric material in physical contact with both the first seed layer and the first conductive feature; and
a semiconductor strip adjacent to the ferroelectric material.

9. The semiconductor device of claim 8, further comprising:
a bit line adjacent to the semiconductor strip; and
a source line on an opposite side of a dielectric material from the bit line.

10. The semiconductor device of claim 9, further comprising:
a bit line interconnect directly overlying and in electrical connection with the bit line; and
a source line interconnect directly overlying and in electrical connection with the source line, wherein the bit line interconnect and the source line interconnect are parallel with each other.

11. The semiconductor device of claim 8, wherein a first combination of the first conductive feature and the first seed layer has a first width and wherein a second combination of the second conductive feature and the second seed layer has the first width.

12. The semiconductor device of claim 8, wherein a first combination of the first conductive feature and the first seed layer has a first width, wherein a second combination of the second conductive feature and the second seed layer has a second width, and wherein the second width is different from the first width.

13. The semiconductor device of claim 8, further comprising a conductive strip between the ferroelectric strip and the semiconductor strip.

14. The semiconductor device of claim 13, wherein the conductive strip has a thickness between about 1 nm and about 20 nm.

15. A semiconductor device comprising:
a stack of word lines, wherein each word line comprises:
multiple seed layers in physical contact with each other;
multiple conductive elements on opposing sides of the multiple seed layers;
ferroelectric materials adjacent to respective ones of each of the word lines within the stack of word lines; and
semiconductor strips adjacent to respective ones of the ferroelectric materials.

16. The semiconductor device of claim 15, wherein two of the multiple seed layers collectively form an "H" shape.

17. The semiconductor device of claim 15, wherein a first one of the multiple seed layers comprises a first material and a second one of the multiple seed layers comprises a second material different from the first material.

18. The semiconductor device of claim 15, wherein a first one of the multiple seed layers comprises a first material and a second one of the multiple seed layers comprises the first material.

19. The semiconductor device of claim 15, further comprising conductive strips located between respective ones of the ferroelectric materials and the semiconductor strips.

20. The semiconductor device of claim 19, wherein the conductive strips comprise ruthenium.

* * * * *